United States Patent [19]
Nagata et al.

[11] Patent Number: 5,826,197
[45] Date of Patent: Oct. 20, 1998

[54] MOBILE COMMUNICATION SYSTEM USING BASE STATION FREQUENCY CORRECTION SCHEME

[75] Inventors: Kiyohito Nagata, Yokohamashi; Teruya Fujii, Yokosukashi; Katsunori Hamada; Kazuhiko Kakinuma, both of Yokohamashi; Masaaki Yoshimi, Fujisawashi; Tatsuaki Wakabayashi, Yokosukashi, all of Japan

[73] Assignee: NTT Mobile Communications Network, Inc., Tokyo, Japan

[21] Appl. No.: 605,065

[22] PCT Filed: Jul. 6, 1995

[86] PCT No.: PCT/JP95/01353

§ 371 Date: Mar. 5, 1996

§ 102(e) Date: Mar. 5, 1996

[87] PCT Pub. No.: WO96/01545

PCT Pub. Date: Jan. 18, 1996

[30] Foreign Application Priority Data

| Jul. 6, 1994 | [JP] | Japan | 6/154975 |
| Jul. 6, 1994 | [JP] | Japan | 6/155054 |
| Dec. 28, 1994 | [JP] | Japan | 6/328272 |

[51] Int. Cl.$^6$ ........................... H04B 7/00
[52] U.S. Cl. ............... 455/524; 455/517; 455/502
[58] Field of Search .................. 455/51.1, 51.2, 455/67.1, 70, 71, 75, 76, 54.1, 56.1, 12.1, 13.1, 13.2, 502, 503, 517–524; 370/324; 375/344

[56] References Cited

U.S. PATENT DOCUMENTS

| 4,509,200 | 4/1985 | Luginbuhl et al. . |
| 4,901,368 | 2/1990 | Arnold et al. ...................... 455/12.1 |
| 5,471,648 | 11/1995 | Gourgue . |
| 5,613,193 | 3/1997 | Ishikawa et al. ...................... 455/12.1 |

*Primary Examiner*—Chi H. Pham
*Assistant Examiner*—Gertrude Arthur
*Attorney, Agent, or Firm*—Oblon, Spivak, McClelland, Maier, & Neustadt, P.C.

[57] ABSTRACT

A mobile communication system having a high precision frequency base station device with a high precision frequency generator, and the other low precision frequency base station device with a low precision frequency generator which receives transmission waves from the high precision frequency base station device using a transmission frequency in a prescribed frequency precision, and carries out transmission and reception by controlling transmission and reception frequencies of own station in accordance with the frequency precision of the received transmission waves. It is also fine to provide a mobile station device for a mobile station which receives the transmission waves from the high precision frequency base station device, controls a reference frequency to be a reference for transmission and reception frequencies of own station in accordance with the frequency precision of the received transmission waves, and carries out transmission and reception with respect to a base station using transmission and reception frequencies according to the controlled reference frequency, and make the low precision frequency base station device to receive the transmission waves from the mobile station device carrying out transmission and reception using the transmission and reception frequencies according to the controlled reference frequency, control a reference frequency to be a reference for transmission and reception frequencies of own station in accordance with the frequency precision of the received transmission waves, and carry out transmission and reception with respect to the mobile station using transmission and reception frequencies according to the controlled reference frequency. (FIG. 1)

41 Claims, 14 Drawing Sheets

R : GUARD TIME FOR BURSTY TRANSIENT RESPONSE

P : PREAMBLE

TCH : USER INFORMATION

SW : SYNCHRONIZATION WORD

CC : COLOR CODE

SACCH/RCH : SLOW ACCH/ HOUSEKEEPING BIT

G : GUARD TIME

MOBILE COMMUNICATION SYSTEM USING BASE STATION FREQUENCY CORRECTION SCHEME

TECHNICAL FIELD

The present invention relates to a frequency correction scheme for setting up transmission and reception frequencies of each base station at high precision, in a mobile communication system in which a plurality of radio base stations form respective radio zones, and a mobile station makes communications with the base stations while moving within the radio zones and among the radio zones.

BACKGROUND ART

In a mobile communication scheme, it is necessary for a precision of a transmission frequency from a base station to be a high precision. This is because, when an error of a transmission frequency of a base station has a large value for example, it is going to interfere with other base stations and mobile stations which make communications at neighboring frequencies, and as a result the frequency utilization efficiency is going to be deteriorated.

In addition, in a digital mobile communication scheme using phase modulation, there is also a case in which it becomes impossible to demodulate when a frequency error at a mobile station and a base station becomes greater than or equal to a certain tolerable value.

Consequently, in a base station of a conventional mobile communication scheme, a thermostatic chamber type frequency generator is provided in a transmission and reception device of a base station, so as to realize a high precision.

However, a high precision thermostatic chamber type frequency generator used in a transmission and reception device of a base station is expensive, as well as voluminous, and there is a problem that it is impossible to realize an economical and compact base station transmission and reception device.

On the other hand, in a mobile communication system, a mobile station moves through a plurality of radio zones and makes communication while receiving radio signals from a base station of each radio zone, so that it is necessary for a frequency precision of each base station to be a high precision and the same throughout an entire service area.

Consequently, in a conventional mobile communication system, a frequency precision of an entire service area is made uniform by providing a high precision reference frequency generator in a base station. In particular, no function for correcting a reference frequency of a base station is provided, and only a mobile station makes own station's reference frequency correction with respect to a reception frequency.

In such a conventional mobile communication system, at a time of channel switching during a zone transition while in communication, a switching operation is carried out at a mobile station side after own station's frequency is corrected to a frequency of a moving destination, so that a communication impossible time during a channel switching increases. Also, there is a drawback that a possibility for being absent upon arrival of a call increases in a case of waiting for receiving a call.

In addition, as described above, each base station is expensive as it has a high precision reference frequency generator, and a device size becomes large because of a use of a thermostatic chamber type reference frequency generator, etc., and in conjunction with that, there is a problem that a construction of a system becomes difficult as it becomes difficult to select a location to set up the device, etc.

DISCLOSURE OF THE INVENTION

Therefore, the present invention has an object to provide a base station frequency correction scheme in a mobile communication system and a mobile station device and a base station device for that purpose which are capable of setting transmission and reception frequencies in high precision, without using an expensive and voluminous high precision frequency generator.

Also, the present invention has another object to provide a base station frequency correction scheme in a mobile communication system in which it is made economical by setting a frequency precision of each base station in high precision inexpensively, while the inconvenience at times of waiting for receiving a call and radio zone transition are resolved and an improvement of a service is realized.

According to one aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized by having: a high precision frequency base station device having a high precision frequency generator; and a low precision frequency base station device having a low precision frequency generator other than said high precision frequency base station device, which receives transmission waves from said high precision frequency base station device using a transmission frequency in a prescribed frequency precision, and carries out transmission and reception by controlling transmission and reception frequencies of own station in accordance with the frequency precision of the received transmission waves.

According to another aspect of the present invention, there is provided a base station device for each base station in a mobile communication system formed by a plurality of base stations with not always uniform transmission and reception frequency precision for forming a plurality of radio zones, and a mobile station for making communications via said plurality of base stations while moving within said plurality of radio zones, the base station device characterized by having: reception means for receiving transmission waves from another base station using a transmission frequency in a prescribed frequency precision; frequency control means for controlling transmission and reception frequencies of own station in accordance with the frequency precision of the transmission waves received by said reception means; and a transmission and reception device for carrying out transmission and reception using the transmission and reception frequencies controlled by said frequency control means.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized by having: a high precision frequency base station device having a high precision frequency generator; a mobile station device for a mobile station which receives the transmission waves from said high precision frequency base station device using the transmission frequency in a prescribed frequency precision, controls a reference frequency to be a reference for transmission and reception frequencies of own station in accordance with the frequency precision of the received transmission waves, and carries out transmission and reception with respect to a base station using transmission and reception frequencies according to the controlled reference frequency; and a low precision frequency base station device having a low precision frequency generator other than said high precision frequency base station device, which receives the transmission waves from the mobile station device carrying out transmission and reception using the transmission and reception frequencies according to the controlled reference frequency, controls a reference frequency to be a reference for transmission and reception frequencies of own station in accordance with the frequency precision of the received transmission waves, and carries out transmission and reception with respect to the mobile station using transmission and reception frequencies according to the controlled reference frequency.

According to another aspect of the present invention, there is provided a mobile station device for a mobile station in a mobile communication system formed by a plurality of base stations with not always uniform transmission and reception frequency precision for forming a plurality of radio zones, and a mobile station for making communications via said plurality of base stations while moving within said plurality of radio zones, the mobile station device characterized by having: means for receiving transmission waves from a base station, and judging that the received transmission waves are in a high precision frequency; means for controlling a reference frequency to be a reference for transmission and reception frequencies of own station in accordance with the frequency precision of the transmission waves received by said receiving and judging means; and transmission and reception means for carrying out transmission and reception with respect to a base station using the transmission and reception frequencies according to the reference frequency controlled by said controlling means.

According to another aspect of the present invention, there is provided a base station device for each base station in a mobile communication system formed by a plurality of base stations with not always uniform transmission and reception frequency precision for forming a plurality of radio zones, and a mobile station for making communications via said plurality of base stations while moving within said plurality of radio zones, the base station device characterized by having: means for receiving transmission waves from a mobile station, and judging that the received transmission waves are in a high precision frequency; means for controlling a reference frequency to be a reference for transmission and reception frequencies of own station in accordance with the frequency precision of the transmission waves received by said receiving and judging means; and transmission and reception means for carrying out transmission and reception with respect to a mobile station using the transmission and reception frequencies according to the reference frequency controlled by said controlling means.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that: a base station device for each base station has: reception means for receiving transmission waves from another base station using a transmission frequency in a prescribed frequency precision, and judging that the received transmission waves are in a high precision frequency from a frequency precision information contained in the received transmission waves; frequency control means for controlling a reference frequency to be a reference for transmission and reception frequencies of own station in accordance with the frequency precision of the transmission waves received by said reception means, when the reception means judged that the received transmission waves are in a high precision frequency; and transmission means for transmitting transmission waves which contain a frequency precision information indicating that a frequency precision of a transmission frequency is a high precision, using the transmission frequency according to the reference frequency controlled by said frequency control means, after the frequency control means controlled the reference frequency of own station in accordance with the frequency precision of the transmission waves received by said reception means.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that: a base station device for each base station has: reception means for detecting presence/absence of transmission waves from another base station, and notifying a transmission frequency of the detected transmission waves to a mobile station located in a radio zone of own station, to make the mobile station to recognize whether the detected transmission waves is in a high precision frequency and return a recognition result; frequency control means for controlling a reference frequency to be a reference for transmission and reception frequencies of own station in accordance with the frequency precision of the detected transmission waves, when the recognition result returned from the mobile station indicates that the detected transmission waves are in a high precision frequency; and transmission means for transmitting transmission waves which contain a frequency precision information indicating that a frequency precision of a transmission frequency is a high precision, using the transmission frequency according to the reference frequency controlled by said frequency control means, after the frequency control means controlled the reference frequency of own station in accordance with the frequency precision of the detected transmission waves; and a mobile station device for a mobile station has: recognition means for receiving the transmission waves using the transmission frequency notified from said reception means of the base station of a currently located area, and recognizing whether the received transmission waves are in a high precision frequency from the frequency precision information contained in the received transmission waves; and recognition result returning means for returning the recognition result obtained by the recognition means to the base station of a currently located area.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that: a base station device for each base station has: recognition means for detecting presence/absence of transmission waves of a mobile station currently in communication with another base station, and recognizing whether the detected transmission waves are in a high precision frequency from a frequency precision information contained in the detected transmission waves; and frequency control means for controlling a reference frequency to be a reference for transmission and reception frequencies of own station in accordance with the frequency precision of the detected transmission waves, when the recognition means recognized that the detected transmission waves are in a high precision frequency.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of transmitting transmission waves using a transmission frequency in a prescribed frequency precision from a high precision frequency base station device having a high precision frequency generator; and a step of carrying out transmission and reception by receiving the transmission waves from said high precision frequency base station device, and controlling transmission and reception frequencies of own station in accordance with the frequency precision of the received transmission waves, at a low precision frequency base station device having a low precision frequency generator other than said high precision frequency base station device.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of transmitting transmission waves using a transmission frequency in a prescribed frequency precision from a high precision frequency base station device having a high precision frequency generator; a step of receiving the transmission waves from said high precision frequency base station device, controlling a reference frequency to be a reference for transmission and reception frequencies of own station in accordance with the frequency precision of the received transmission waves, and carrying out transmission and reception with respect to a base station using transmission and reception frequencies according to the controlled reference frequency, at a mobile station device for a mobile station; and a step of receiving the transmission waves from the mobile station device carrying out transmission and reception using the transmission and reception frequency according to the controlled reference frequency, controlling a reference frequency to be a reference for transmission and reception frequencies of own station in accordance with the frequency precision of the received transmission waves, and carrying out transmission and reception with respect to the mobile station using transmission and reception frequencies according to the controlled reference frequency, at a low precision frequency base station device having a low precision frequency generator other than said high precision frequency base station device.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of receiving transmission waves from another base station using a transmission frequency in a prescribed frequency precision, and judging that the received transmission waves are in a high precision frequency from a frequency precision information contained in the received transmission waves, at a base station device for each base station; a step of controlling a reference frequency to be a reference for transmission and reception frequencies of own station in accordance with the frequency precision of the received transmission waves, at a base station device for each base station, when the receiving and judging step judged that the received transmission waves are in a high precision frequency; and a step of transmitting transmission waves which contain a frequency precision information indicating that a frequency precision of a transmission frequency is a high precision, using the transmission frequency according to the reference frequency controlled by said controlling step, at a base station device for each base station, after the controlling step controlled the reference frequency of own station in accordance with the frequency precision of the received transmission waves.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of detecting presence/absence of transmission waves from another base station, and notifying a transmission frequency of the detected transmission waves to a mobile station located in a radio zone of own station, at a base station device for each base station; a step of receiving the transmission waves using the transmission frequency notified from the base station of a currently located area at the detecting and notifying step, and recognizing whether the received transmission waves are in a high precision frequency from the frequency precision information contained in the received transmission waves, at a mobile station device for a mobile station; a step of returning a recognition result obtained by the receiving and recognizing step to the base station of a currently located area, at a mobile station device for a mobile station; a step of controlling a reference frequency to be a reference for transmission and reception frequencies of own station in accordance with the frequency precision of the detected transmission waves, at a base station device for each base station, when the recognition result returned from the mobile station at the returning step indicates that the detected transmission waves are in a high precision frequency; and a step of transmitting transmission waves which contain a frequency precision information indicating that a frequency precision of a transmission frequency is a high precision, using the transmission frequency according to the reference frequency controlled by said controlling step, at a base station device for each base station, after said controlling step controlled the reference frequency in accordance with the frequency precision of the detected transmission waves.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of detecting presence/absence of transmission waves of a mobile station currently in communication with another base station, and recognizing whether the detected transmission waves are in a high precision frequency from a frequency precision information contained in the detected transmission waves, at a base station device of each base station; and a step of controlling a reference frequency to be a reference for transmission and reception frequencies of own station in accordance with the frequency precision of the detected transmission waves, at a base station device of each base station, when the detecting and recognizing step recognized that the detected transmission waves are in a high precision frequency.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that: said plurality of base stations are in a prescribed ordered relationship and having means for mutually notifying an information indicating the prescribed ordered relationship, and each base station comprises a base station device which receives transmission waves from another base station device, judges whether or not to make a frequency correction according to said prescribed ordered relationship, and carries out transmission and reception by controlling transmission and reception frequencies of own station in accordance with the frequency precision of the received transmission waves in a case of judging that the frequency correction is to be made.

According to another aspect of the present invention, there is provided a base station device for each base station in a mobile communication system formed by a plurality of base stations with not always uniform transmission and reception frequency precision for forming a plurality of radio zones, and a mobile station for making communications via said plurality of base stations while moving within said plurality of radio zones, where said plurality of base stations are in a prescribed ordered relationship and having means for mutually communicating an information indicating the prescribed ordered relationship, the base station device characterized by having: reception means for receiving transmission waves from another base station device; frequency control means for judging whether or not to make a frequency correction according to said prescribed ordered relationship, and controlling transmission and reception frequencies of own station in accordance with the frequency precision of the transmission waves received by said reception means in a case of judging that the frequency correction is to be made; and a transmission and reception device for carrying out transmission and reception using the transmission and reception frequencies controlled by said frequency control means.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized by having: a mobile station device for a mobile station which receives transmission waves from one of said plurality of base stations, controls a reference frequency to be a reference for transmission and reception frequencies of own station in accordance with a frequency precision of the received transmission waves, and carries out transmission and reception with respect to a base station using the transmission and reception frequencies according to the controlled reference frequency; and a base station device which receives the transmission waves from the mobile station device carrying out transmission and reception using the transmission and reception frequencies according to the controlled reference frequency, controls a reference frequency to be a reference for transmission and reception frequencies of own station in accordance with the frequency precision of the received transmission waves, and carries out transmission and reception with respect to the mobile station using the transmission and reception frequencies according to the controlled reference frequency.

According to another aspect of the present invention, there is provided a base station device for each base station in a mobile communication system formed by a plurality of base stations with not always uniform transmission and reception frequency precision for forming a plurality of radio zones, and a mobile station for making communications via said plurality of base stations while moving within said plurality of radio zones, the base station device characterized by having: means for receiving transmission waves from a mobile station, and judging that the received transmission waves are according to a reference frequency controlled with respect to one of said plurality of base stations; means for controlling a reference frequency to be a reference for transmission and reception frequencies of own station in accordance with a frequency precision of the transmission waves received by said receiving and judging means; and transmission and reception means for carrying out transmission and reception with respect to a mobile station using the transmission and reception frequencies according to the reference frequency controlled by said controlling means.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that: a base station device for each base station has: reception means for receiving transmission waves from another base station, and judging that the received transmission waves are already frequency corrected from a frequency precision information contained in the received transmission waves; frequency control means for controlling a reference frequency to be a reference for transmission and reception frequencies of own station in accordance with the frequency precision of the transmission waves received by said reception means, when the reception means judged that the received transmission waves are already frequency corrected; and transmission means for transmitting transmission waves which contain a frequency precision information indicating that a frequency precision of a transmission frequency is already frequency corrected, using the transmission frequency according to the reference frequency controlled by said frequency control means, after the frequency control means controlled the reference frequency of own station in accordance with the frequency precision of the transmission waves received by said reception means.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that: a base station device for each base station has: reception means for detecting presence/absence of transmission waves from another base station, and notifying a transmission frequency of the detected transmission waves to a mobile station located in a radio zone of own station, to make the mobile station to recognize whether the detected transmission waves is already frequency corrected and return a recognition result; frequency control means for controlling a reference frequency to be a reference for transmission and reception frequencies of own station in accordance with the frequency precision of the detected transmission waves, when the recognition result returned from the mobile station indicates that the detected transmission waves are already frequency corrected; and transmission means for transmitting transmission waves which contain a frequency precision information indicating that a frequency precision of a transmission frequency is already frequency corrected, using the transmission frequency according to the reference frequency controlled by said frequency control means, after the frequency control means controlled the reference frequency of own station in accordance with the frequency precision of the detected transmission waves; and a mobile station device for a mobile station has: recognition means for receiving the transmission waves using the transmission frequency notified from said reception means of the base station of a currently located area, and recognizing whether the received transmission waves are already frequency corrected from the frequency precision information contained in the received transmission waves; and recognition result returning means for returning the recognition result obtained by the recognition means to the base station of a currently located area.

According to another aspect of the present invention, there is provided a mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that: a base station device for each base station has: recognition means for detecting presence/absence of transmission waves of a mobile station currently in communication with another base station, and recognizing whether the detected transmission waves are already frequency corrected from a frequency precision information contained in the detected transmission waves; and frequency control means for controlling a reference frequency to be a reference for transmission and reception frequencies of own station in accordance with the frequency precision of the detected transmission waves, when the recognition means recognized that the detected transmission waves are already frequency corrected.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, where said plurality of base stations are in a prescribed ordered relationship and having means for mutually notifying an information indicating the prescribed ordered relationship, the mobile communication scheme characterized by having: a step of receiving transmission waves from another base station device, at a base station device for each base station; and a step of judging whether or not to make a frequency correction according to said prescribed ordered relationship, and carries out transmission and reception by controlling transmission and reception frequencies of own station in accordance with the frequency precision of the received transmission waves in a case of judging that the frequency correction is to be made, at a base station device for each base station.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of receiving transmission waves from a base station device for one of said plurality of base stations, controlling a reference frequency to be a reference for transmission and reception frequencies of own station in accordance with a frequency precision of the received transmission waves, and carrying out transmission and reception with respect to a base station using the transmission and reception frequencies according to the controlled reference frequency, at a mobile station device for a mobile station; and a step of receiving the transmission waves from the mobile station device carrying out transmission and reception using the transmission and reception frequencies according to the controlled reference frequency, controlling a reference frequency to be a reference for transmission and reception frequencies of own station in accordance with the frequency precision of the received transmission waves, and carrying out transmission and reception with respect to the mobile station using the transmission and reception frequencies according to the controlled reference frequency, at a base station device for each base station.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of receiving transmission waves from another base station, and judging that the received transmission waves are already frequency corrected from a frequency precision information contained in the received transmission waves, at a base station device for each base station; a step of controlling a reference frequency to be a reference for transmission and reception frequencies of own station in accordance with the frequency precision of the received transmission waves, at a base station device for each base station, when the receiving and judging step judged that the received transmission waves are already frequency corrected; and a step of transmitting transmission waves which contain a frequency precision information indicating that a frequency precision of a transmission frequency is already frequency corrected, using the transmission frequency according to the reference frequency controlled at said controlling step, at a base station device for each base station, after the controlling step controlled the reference frequency of own station in accordance with the frequency precision of the received transmission waves.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of detecting presence/absence of transmission waves from another base station, and notifying a transmission frequency of the detected transmission waves to a mobile station located in a radio zone of own station, at a base station device for each base station; a step of receiving the transmission waves using the transmission frequency notified from the base station of a currently located area at the detecting and notifying step, and recognizing whether the received transmission waves are already frequency corrected from the frequency precision information contained in the received transmission waves, at a mobile station device for a mobile station; a step of returning a recognition result obtained by the receiving and recognizing step to the base station of a currently located area, at a mobile station device for a mobile station; a step of controlling a reference frequency to be a reference for transmission and reception frequencies of own station in accordance with the frequency precision of the detected transmission waves, at a base station device for each base station, when the recognition result returned from the mobile station at the returning step indicates that the detected transmission waves are already frequency corrected; and a step of transmitting transmission waves which contain a frequency precision information indicating that a frequency precision of a transmission frequency is already frequency corrected, using the transmission frequency according to the reference frequency controlled by said controlling step, at a base station device for each base station, after said controlling step controlled the reference frequency in accordance with the frequency precision of the detected transmission waves.

According to another aspect of the present invention, there is provided a mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having: a step of detecting presence/absence of transmission waves of a mobile station currently in communication with another base station, and recognizing whether the detected transmission waves are already frequency corrected from a frequency precision information contained in the detected transmission waves, at a base station device for each base station; and a step of controlling a reference frequency to be a reference for transmission and reception frequencies of own station in accordance with the frequency precision of the detected transmission waves, at a base station device of each base station, when the detecting and recognizing step recognized that the detected transmission waves are already frequency corrected.

BEST MODE FOR CARRYING OUT THE INVENTION

First, with references to FIG. 1 to FIG. 2, the first embodiment of the present invention will be described.

Figure 1:
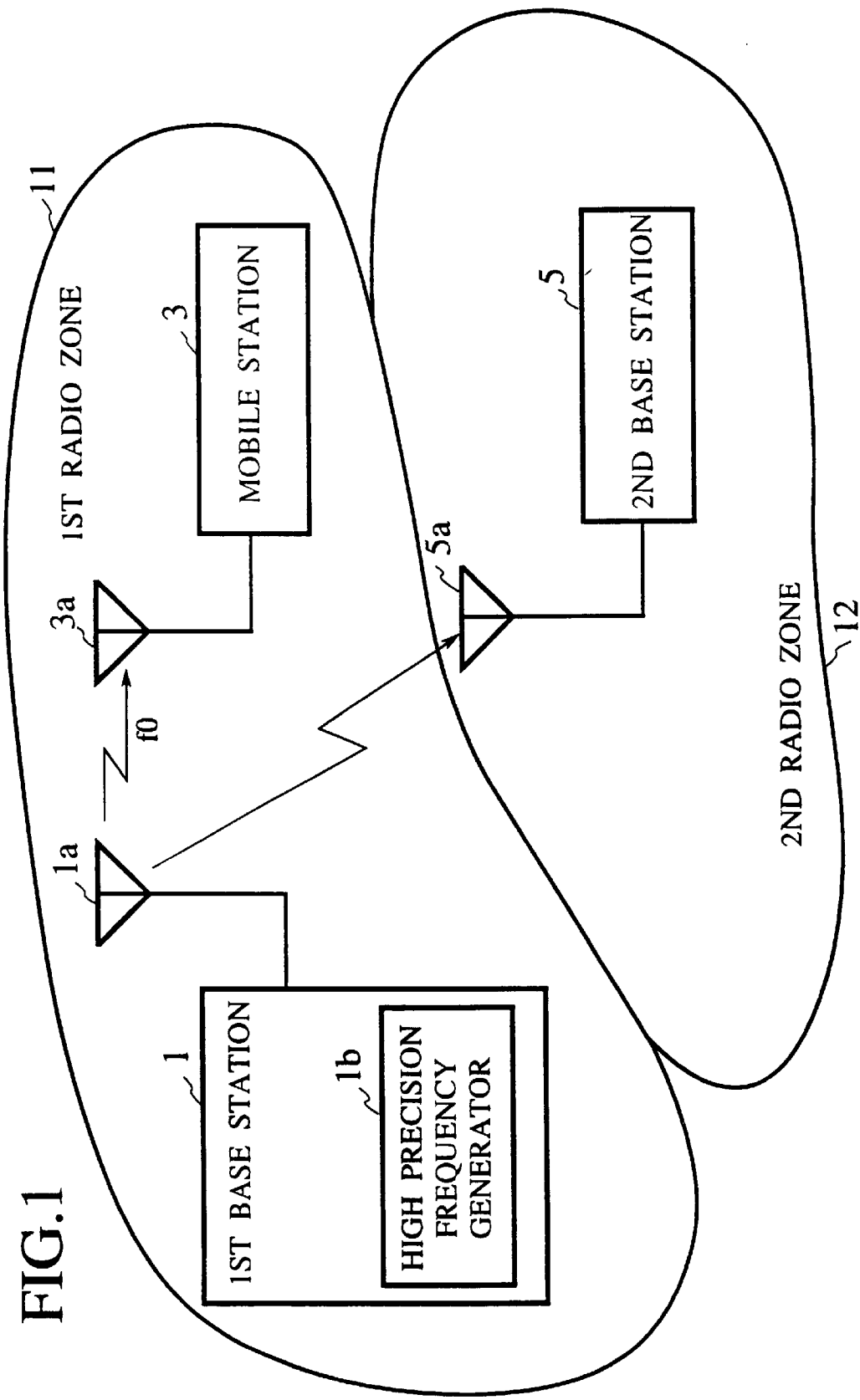
FIG. 1 is a schematic diagram showing an overall configuration of a mobile communication system according to the first embodiment of the present invention.

FIG. 1 is a figure showing an overall configuration of a mobile communication system according to the first embodiment of the present invention. The mobile communication system shown in FIG. 1 comprises a first radio zone 11 containing a first base station 1 and a mobile station 3, and a second radio zone 12 containing a second base station 5. The first base station 1 and the mobile station 3 make communication by a frequency f0 via an antenna 1a and antenna 3a.

In the mobile communication system of this first embodiment, a high precision frequency generator is provided only in some base stations among a plurality of base stations constituting the respective radio zones, and in the other base stations, such a high precision frequency generator is not provided but an inexpensive and compact frequency generator is provided instead while a base station device configuration as described below is adopted, and by means of this, the transmission and reception frequencies in high precision are realized for these other base stations by using only an inexpensive and compact frequency generator.

To this end, in FIG. 1, a high precision frequency generator 1b is provided in the first base station 1. On the other hand, the second base station 5 adopts the base station device configuration having a transmission and reception unit as shown in FIG. 2, as one of the above noted other base stations, and a frequency generator of this second base station 5 is not a particularly high precision one but an inexpensive and compact one.

Figure 2:
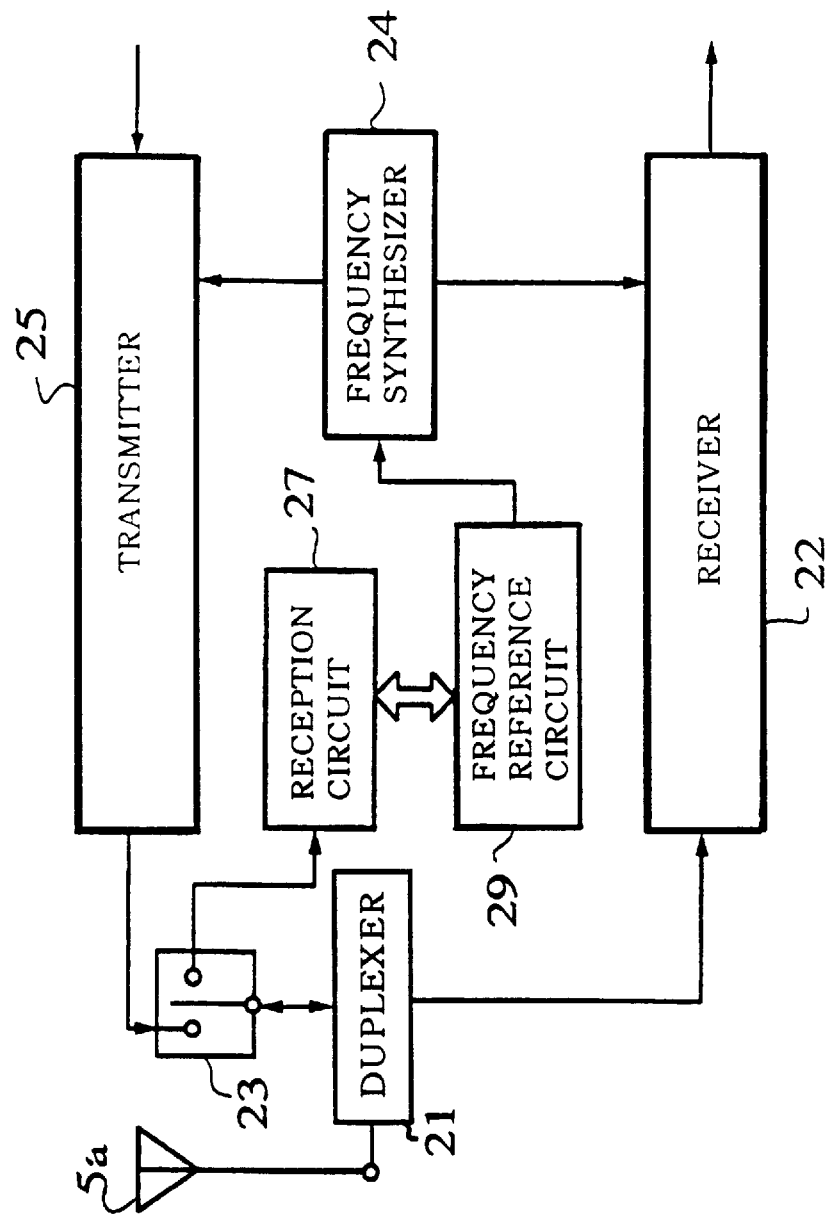
FIG. 2 is a block diagram showing a configuration of a transmission and reception unit of a low precision frequency base station in the mobile communication system shown in FIG. 1.

Here, as shown in FIG. 2, the transmission and reception unit of the second base station 5 which has no high precision frequency generator comprises a duplexer 21 connected with an antenna 5a for separating a transmission frequency and a reception frequency, a switch 23 connected with the duplexer 21, a transmitter 25 connected with one junction of the switch 23, a reception circuit 27 connected with another junction of said switch 23, a frequency reference circuit 29 connected with the reception circuit 27, a receiver 22 connected with said duplexer 21, and a frequency synthesizer 24 connected with the receiver 22 and said transmitter 25.

The second base station 5 with the transmission and reception unit so configured switches the switch 23 to the reception circuit 27 side before the start of a communication with the mobile station, in order to correct the transmission and reception frequencies of own station, and by means of this, the second base station 5 receives the transmission signals from the first base station 1 having the high precision frequency generator 1b by the antenna 5a, and enters these received signals into the reception circuit 27 via the duplexer 21 and the switch 23. Here, the judgement as to whether these received signals are signals from the first base station 1 having the high precision frequency generator 1b or not can be made by a method based on a frequency, a method based on demodulated data, etc.

The reception circuit 27, to which the received signals from the first base station 1 are entered, controls the frequency of the frequency reference circuit 29 such that it is set in the same level of the frequency precision as the frequency precision of said received signals, by utilizing the technique disclosed in Japanese Patent Application Laid Open No. 63-281526 (1988), for example.

In this manner, the frequency of the frequency reference circuit 29 is controlled such that it is set in the same level as the frequency precision of said high precision frequency generator 1b which is the frequency precision of the received signals. Also, when a communication is started, the reference signal outputted from this frequency reference circuit 29 is supplied to the frequency synthesizer 24, and by means of this, the frequency synthesizer 24 supplies the local signals for transmission and reception to the transmitter 25 and the receiver 22, respectively, and starts the transmission and reception by means of these.

As described above, according to this first embodiment, the transmission frequency from the other base station having a high precision frequency generator is received at each base station, and the transmission and reception frequencies of own station are autonomously controlled such that it is set in the same level as the precision of this received frequency, so that without providing a high precision frequency generator in each base station, the transmission and reception by the frequencies in high precision can be made at each base station, and it is possible to realize economical and compact base stations in the mobile communication system.

Next, with references to FIG. 3 to FIG. 5, the second embodiment of the present invention will be described.

Figure 3:
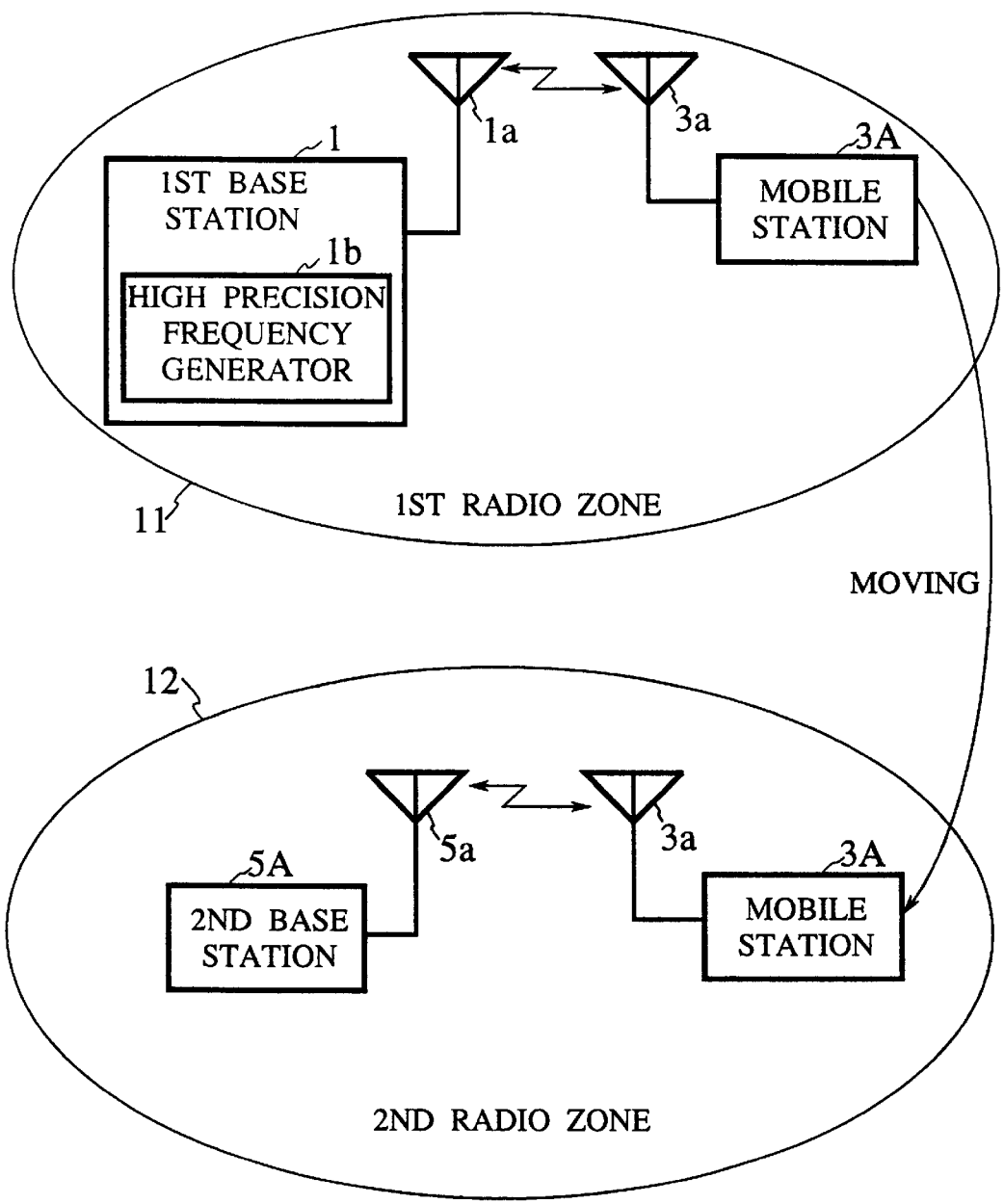
FIG. 3 is a schematic diagram showing an overall configuration of a mobile communication system according to the second embodiment of the present invention.

FIG. 3 is a figure showing an overall configuration of a mobile communication system according to the second embodiment of the present invention. The mobile communication system shown in FIG. 3 comprises a first radio zone 11 containing a first base station 1 and a mobile station 3A, and a second radio zone 12 containing a second base station 5A and the mobile station 3A which has moved from the first radio zone 11. In the first radio zone 11, the first base station 1 and the mobile station 3A make communication via an antennas 1a and 3a, and in a case where this mobile station 3A has moved to the second radio zone 12, the mobile station 3A and the second base station 5A make communication via antennas 3a and 5a.

In the mobile communication system of this second embodiment, a high precision frequency generator is provided only in some base stations among a plurality of base stations constituting the respective radio zones, and such a high precision frequency generator is not provided but an inexpensive and compact frequency generator is provided instead in the other base stations, while a mobile station device configuration and a base station device configuration as described below are adopted in the mobile station and these other base stations, respectively, and by means of this, the transmission and reception frequencies in high precision are realized for these other base stations by using only an inexpensive and compact frequency generator.

To this end, in FIG. 3, a high precision frequency generator 1b is provided in the first base station 1. Note that the base station having such a high precision frequency generator 1b will also be referred to as a high precision frequency base station in the following. On the other hand, the second base station 5A adopts the base station device configuration having a transmission and reception unit as described below, as one of the above noted other base stations, and a frequency generator of this second base station 5A is not a particularly high precision one but an inexpensive and compact one. Note that the base station having such a not particularly high precision frequency generator will also be referred to as a low precision frequency base station in the following. In addition, a frequency generator provided in the mobile station 3A is also obviously an inexpensive and compact one. Then, as described below, the mobile station 3A controls a reference frequency to be a reference for transmission and reception frequencies of own station such that it is set in the same level as a transmission frequency of the high precision frequency base station such as the first base station device 1, and the mobile station 3A so controlled makes communication with the second base station device 5A which is one of the above noted other base stations, so that a reference frequency to be a reference for transmission and reception frequencies of the second base station device 5A are controlled such that it is set in the same level as a transmission frequency of the mobile station 3A, and by means of this, the transmission and reception frequencies of the second base station 5A are also appropriately controlled.

Figure 4:
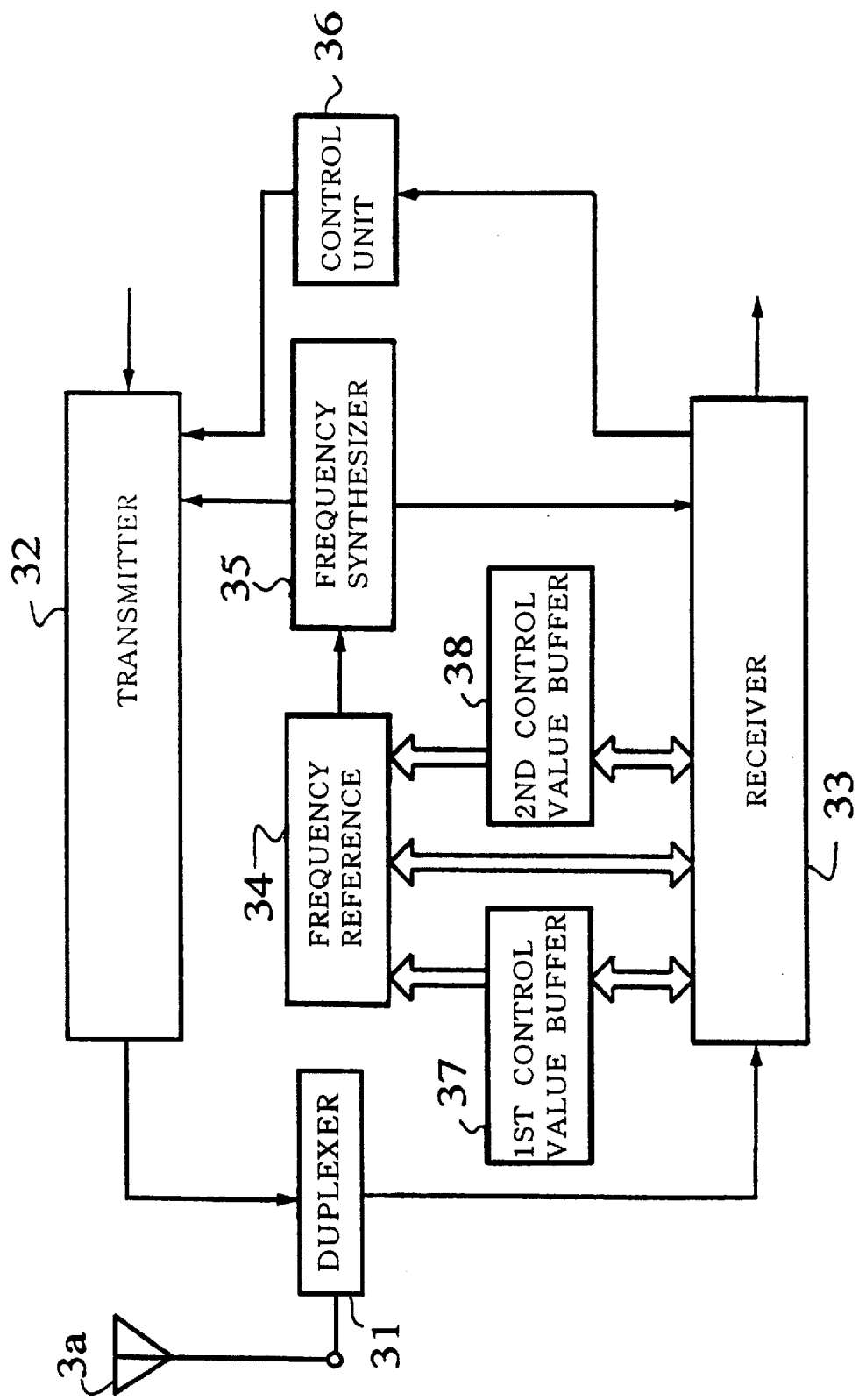
FIG. 4 is a block diagram showing a configuration of a transmission and reception unit of a mobile station in the mobile communication system shown in FIG. 3.

For this reason, the mobile station 3A has the transmission and reception unit as shown in FIG. 4, and this comprises a duplexer 31 connected with an antenna 3a for separating a transmission frequency and a reception frequency, a transmitter 32 and a receiver 33 connected with the duplexer 31, a frequency reference circuit 34 for generating a reference frequency, a frequency synthesizer 35 which is supplied with a reference signal from the frequency reference circuit 34 and which supplies local signals for transmission and local signals for reception to said transmitter 32 and said receiver 33, respectively, and makes the transmitter 32 and the receiver 33 to carry out transmission and reception operations by means of these, a first control value buffer 37 and a second control value buffer 38 for storing a difference between a transmission frequency from the first base station 1 which is the high precision frequency base station and the reference frequency of the mobile station 3A as a control value, and a control unit 36 for controlling an overall operation.

Figure 5:
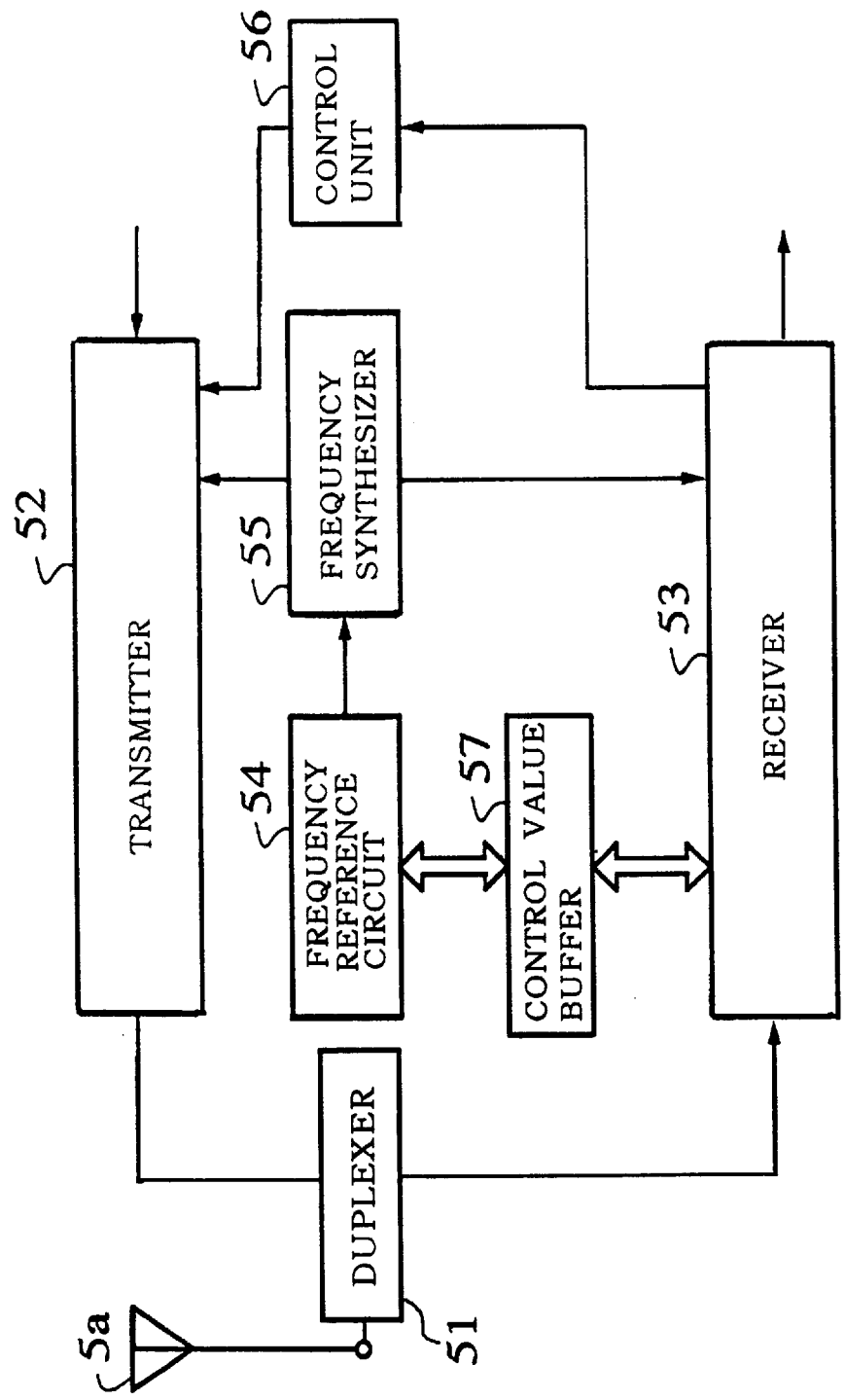
FIG. 5 is a block diagram showing a configuration of a transmission and reception unit of a low precision frequency base station in the mobile communication system shown in FIG. 3.

Also, as shown in FIG. 5, the transmission and reception unit of the second base station 5A which has no high precision frequency generator comprises a duplexer 51 connected with an antenna 5a for separating a transmission frequency and a reception frequency, a transmitter 52 and a receiver 53 connected with the duplexer 51, a frequency reference circuit 54 for generating a reference frequency, a frequency synthesizer 55 which is supplied with a reference signal from the frequency reference circuit 54 and which supplies local signals for transmission and local signals for reception to said transmitter 52 and said receiver 53, respectively, and makes the transmitter 52 and the receiver 53 to carry out transmission and reception operations by means of these, a control value buffer 57 for storing a difference between a transmission frequency from the mobile station 3A and the reference frequency of the second base station 5A as a control value, and a control unit 56 for controlling an overall operation.

In the mobile communication system formed by each base station and the mobile station configured as in the above, the first base station 1 carries out the transmission and reception using a high precision frequency by the high precision frequency generator 1b, whereas the mobile station 3A and the second base station 5A generate the reference frequencies to be references for transmission and reception frequencies by the respective frequency reference circuits 34 and 54, supply these reference frequency signals to the frequency synthesizers 35 and 55, and make the transmitters 32 and 52 and the receivers 33 and 53 to carry out the transmission and reception operations by means of these, and there are cases in which the reference frequencies outputted from these frequency reference circuits 34 and 54 are different from the high precision frequency from the first base station 1.

It is to be noted that, in a case where the radio transmission scheme is the digital phase modulation system for example, it is necessary to make an error between the reception frequency of the mobile station and the transmission frequency of the base station to be less than or equal to a certain tolerable value. Consequently, in a case where the mobile station 3A makes communication with the first base station 1, it is necessary for the mobile station 3A to carry out an operation to control the reference frequency of own station such that it is set in the same level as the precision of the transmission frequency from the first base station 1.

To explain it more concretely, when the mobile station 3A receives the transmission signals from the first base station 1, it controls the reference frequency of the frequency reference circuit 34 of own station such that it is set in the same level of precision as the transmission frequency of the first base station 1 by utilizing the first control value buffer 37, while it stores the control value stored in the first control value buffer 37 by this control also in the second control value buffer 38. Note that, as a method for controlling the reference frequency of the mobile station 3A such that it is set in the same level of precision as the transmission frequency of the first base station 1 in this manner, the technique disclosed in Japanese Patent Application Laid Open No. 63-281526 (1988) can be utilized, for example.

The mobile station 3A which stored said control value in the control value buffers 37 and 38 thereafter controls the reference frequency via the frequency reference circuit 34 according to this stored control value, in particular the control value stored in the second control value buffer 38.

Note that the first base station 1 is made to transmit the transmission data including an information indicating that this first base station 1 is the high precision frequency base station equipped with the high precision frequency generator 1b, so that it is made possible for the mobile station 3A which received the transmission data from this first base station 1 to recognize the fact that the base station in communication is the high precision frequency base station having the high precision frequency generator 1b, i.e., the first base station 1, from the received data.

In a case where the mobile station 3A, which makes communication with the first base station 1 and have its own reference frequency controlled such that it is set in the same level of precision as the transmission frequency of the first base station 1 as described above, moves from the first radio zone 11 to the second radio zone 12 as indicated by an arrow in FIG. 3, and makes communication with the second base station 5A of this second radio zone 12, there are cases in which the transmission and reception frequencies of the second radio zone 12 are different from the transmission and reception frequencies of the mobile station 3A, and in practice cases in which they differ are frequently encountered. Now, supposing that they are different, the mobile station 3A stores said control value in the first control value buffer 37 and the second control value buffer 38 as described above, and it becomes possible to communicate with the second base station 5A by means of controlling the reference frequency of this mobile station 3A such that it is set in the same level as the transmission frequency of the second base station 5A to follow the transmission frequency of the second base station 5A using the first control value buffer 37 which is one of these control value buffers 37 and 38, and detecting the transmission frequency of the second base station 5A.

After the mobile station 3A becomes possible to communicate with the second base station 5A in this manner, the mobile station 3A controls the frequency reference circuit 34 by said control value stored in the second control value buffer 38. As a result, the transmission frequency of the mobile station 3A is set in the same level as the precision of the first base station 1 which is the high precision base station.

After the transmission frequency of the mobile station 3A is set in the same level as the precision of the first base station 1, the second base station 5A which is the low precision base station controls the reference frequency to be a reference for transmission and reception frequencies of this second base station 5A such that it is set in the same level as the precision of the transmission frequency of the mobile station 3A, using the control value buffer 54, so that the frequency of the second base station 5A is set in the same level as the frequency precision of the first base station 1 which is the high precision base station, and the control value at that point is stored in the control value buffer 54.

Note that the mobile station 3A is made to transmit the data containing an information indicating that this station is after having communicated with the first base station 1 which is the high precision frequency base station, to the second base station 5A, while the second base station 5A is made to be capable of judging that the mobile station 3A is after having communicated with the first base station which is the high precision frequency base station from the data received from the mobile station 3A.

As described above, according to this second embodiment, the mobile station receives the transmission frequency from the high precision frequency base station, and controls the reference frequency to be a reference for transmission and reception frequencies of own station such that it is set in the same level as the frequency precision of this received transmission frequency, and in a case where a mobile station to make communication with is the mobile station which is after having communicated with the high precision frequency base station, the low precision frequency base station controls the reference frequency to be a reference for transmission and reception frequencies of own station such that it is set in the same level as the precision of the transmission frequency of the mobile station, so that it is possible for the low precision frequency base station other than the high precision frequency base station to control the frequency of own station such that it is set in the same level of precision as the transmission and reception frequencies of the high precision frequency base station via the mobile station, without providing a high precision frequency generator, and it is possible to realize economical and compact base stations in the mobile communication system.

Next, with references to FIG. 6 to FIG. 11, the third embodiment of the present invention will be described.

Figure 6:
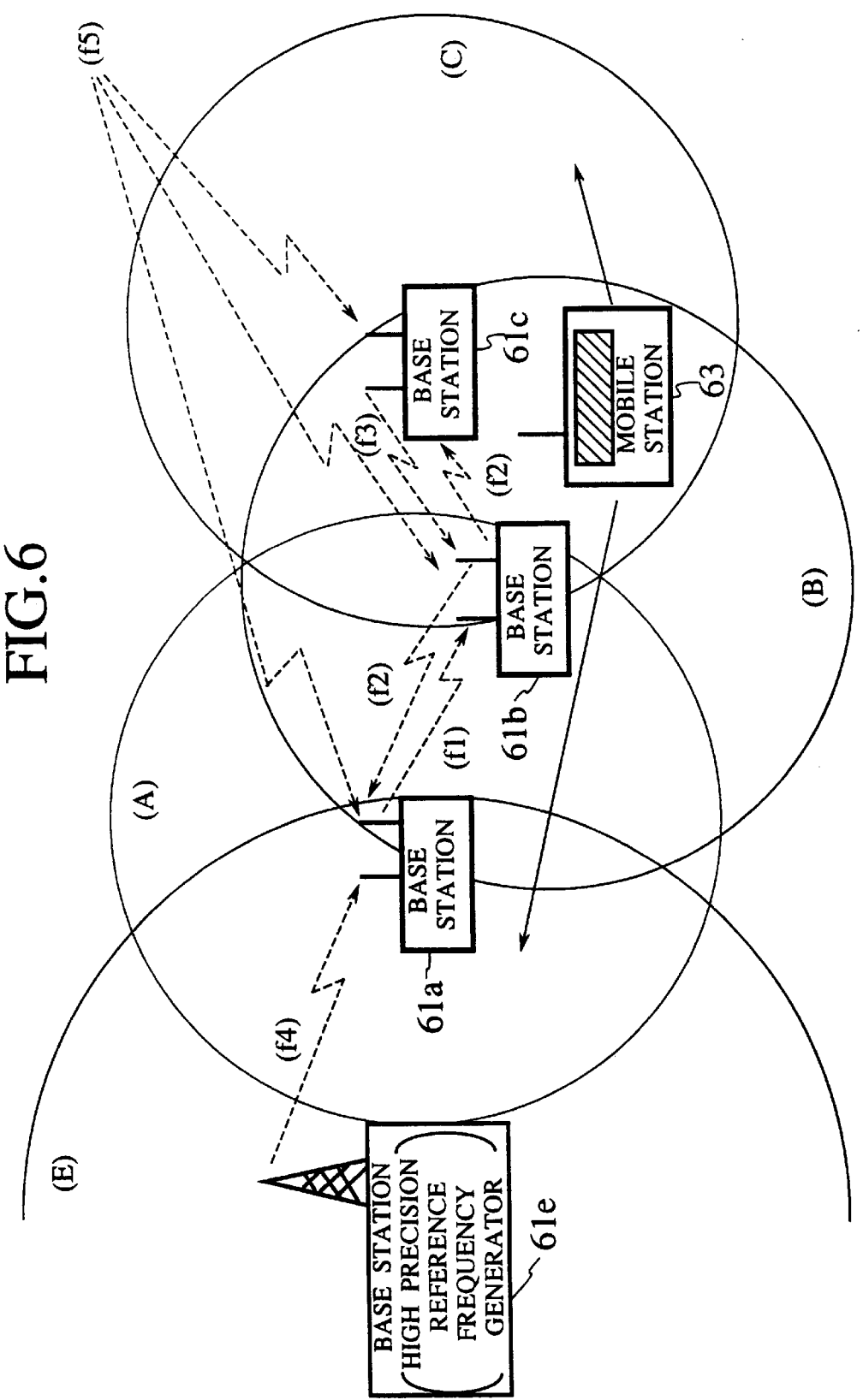
FIG. 6 is a schematic diagram of a mobile communication system for explaining a base station frequency correction scheme in a mobile communication system according to the third embodiment of the present invention.

FIG. 6 is a figure showing an overall configuration of a mobile communication system according to the third embodiment of the present invention. In FIG. 6, 61a, 61b and 61c are base stations without a high precision reference frequency generator, which have functions for receiving, demodulating and frequency correcting a transmission frequency of a base station 61e described below, and which constitute the identical service area, 63 is a mobile station capable of being located in areas of radio zones A, B and C, 61e is a base station having a high precision reference frequency generator, A, B, C and E are radio zones of the base stations 61a, 61b, 61c and 61e, respectively, f1, f2, f3 and f4 are frequencies of transmission waves of the base stations 61a, 61b, 61c and 61e, respectively, and f5 indicates a frequency of unnecessary extraneous waves in the identical frequency bandwidth as the frequencies f1 to f3.

The base station 61a receives and demodulates the respective transmission waves in the frequencies f2, f4 and f5, recognizes from these demodulated signal contents that the frequency f2 is the transmission waves of a base station with a frequency not yet corrected in the identical system, the frequency f4 is the transmission waves of a base station having a high precision reference frequency generator, and the frequency f5 is the extraneous waves that cannot be analyzed, and makes a correction of a reference frequency of own station with respect to the frequency f4.

Also, the base station 61b receives, demodulates and analyzes the transmission waves in the frequencies f1, f3 and f5, recognizes from these that the frequency f1 is the already frequency corrected one, and makes a correction of a reference frequency of own station with respect to this frequency f1.

In addition, the base station 61c receives, demodulates and analyzes the transmission waves in the frequencies f2 and f5, recognizes from these that the frequency f2 is the already frequency corrected one, and makes a correction of a reference frequency of own station with respect to this frequency f2.

As a result, the radio zones A, B and C have a uniform frequency precision without making an erroneous correction of a frequency due to the unnecessary extraneous waves f5, and the frequency precision with an absolute precision as high as the radio zone E is going to be established, so that it becomes possible for the mobile station 63 to make quick and smooth zone transitions in the radio zones A, B and C while waiting for receiving a call or while in communication, without making a correction of a reference frequency to a corresponding base station frequency at each radio zone transition.

Here, in a case where the mobile station 63 has a function and a right to be located in an area of the base station 61e, it also becomes possible to make a quick and smooth zone transition for the radio zone E while waiting for receiving a call or while in communication similarly as described above.

Also, at a time of constructing the service area of the radio zones A, B and C, it becomes possible to manufacture the base stations inexpensively, and due to the compactness of the base stations, it becomes possible to secure the locations to set them up.

Note that, in this third embodiment, as a method for the low precision frequency base station to select a base station of a frequency correction target autonomously, the following concrete examples can be considered.

Figure 7:
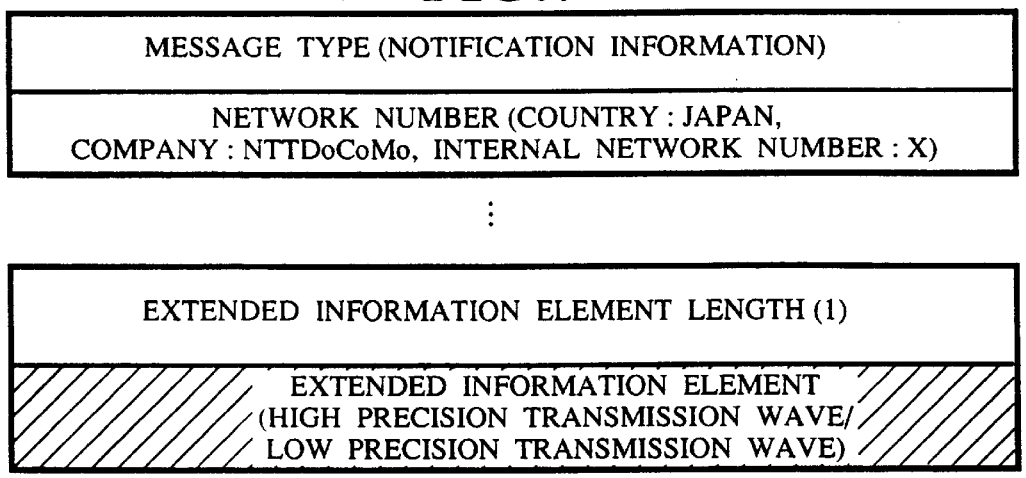
FIG. 7 is a figure showing one example of a notification information message format used in the mobile communication system shown in FIG. 6.
Figure 8:
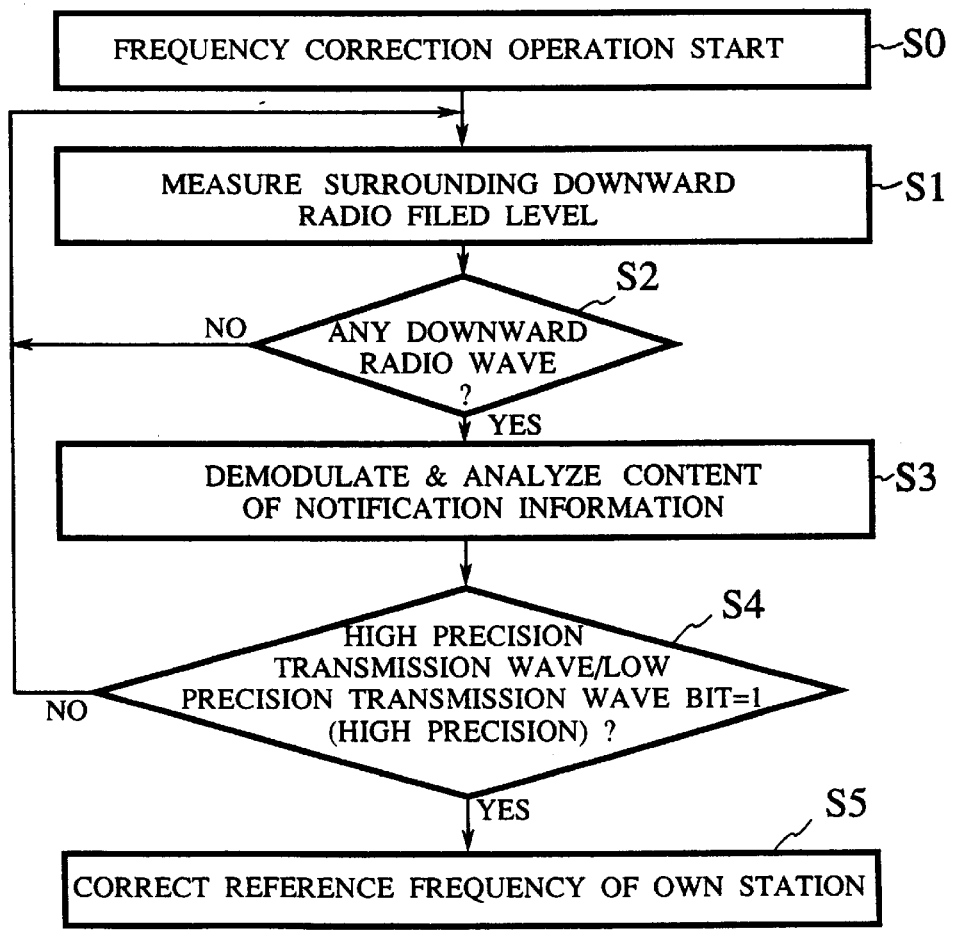
FIG. 8 is a flow chart for the operation of a low precision frequency base station in the mobile communication system shown in FIG. 6 at a time of using the notification information message format shown in FIG. 7.

First, as a first concrete example, a use of a notification information message format as shown in FIG. 7 can be considered. In this case, the operation of the low precision frequency base station 61a in FIG. 6 proceeds according to the flow chart of FIG. 8 as follows.

After the start of the frequency correction operation (S0), the base station 61a carries out a measurement of a surrounding radio field level in the downward frequency bandwidth (S1), judges whether there is any downward radio wave or not (S2), and recognizes the existences of f2 and f4 from the obtained reception levels. Then, the notification information of the radio waves of each of these f2 and f4 is received and demodulated, and its content is analyzed (S3).

Here, in a case where the surrounding radio zones A and E are in the PDC (Personal Digital Cellular Telecommunication System) scheme (based on the RCR (Research and Development Center for Radio Systems) STANDARD (RCR STD-27)), each of the base station 61e and the base station 61b specifies the fact that the transmission frequency of own station is in high precision or in low precision, within an "extended information element" that is newly defined in the notification information of a control channel as shown in FIG. 7, as "high precision transmission wave/low precision transmission wave bit", so that it becomes possible for the base station 61a to recognize that f4 is the radio waves transmitted from the high precision frequency base station 61e. For example, by setting this "high precision transmission wave/low precision transmission wave bit" to 1, it indicates that it is a high precision. Here, in FIG. 7, what is within ( ) indicates the content of each information element, and a shaded portion indicates a newly defined portion.

For this reason, the base station 61a judges whether the "high precision transmission wave/low precision transmission wave bit" of each notification information is 1 or not (S4), and makes a correction of a reference frequency of own station according to the frequency which is judged as being in the high precision (S5).

The base station 61a, which has the frequency precision equivalent to the base station 61e as the frequency correction is made by this method, sets the "high precision transmission wave/low precision transmission wave bit" within the notification information of the transmission waves of own station as the high precision transmission waves.

Figure 9:
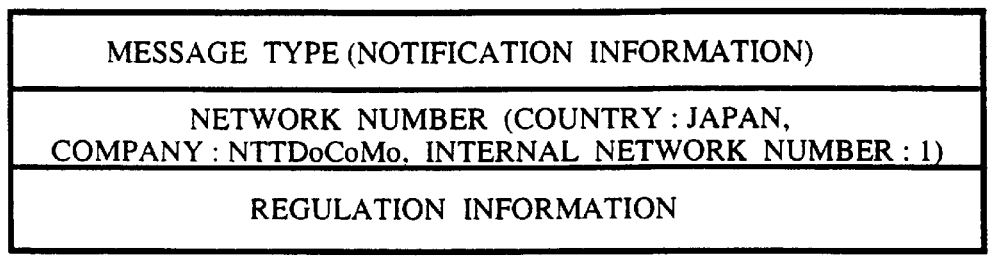
FIG. 9 is a figure showing another example of a notification information message format used in the mobile communication system shown in FIG. 6.
Figure 10:
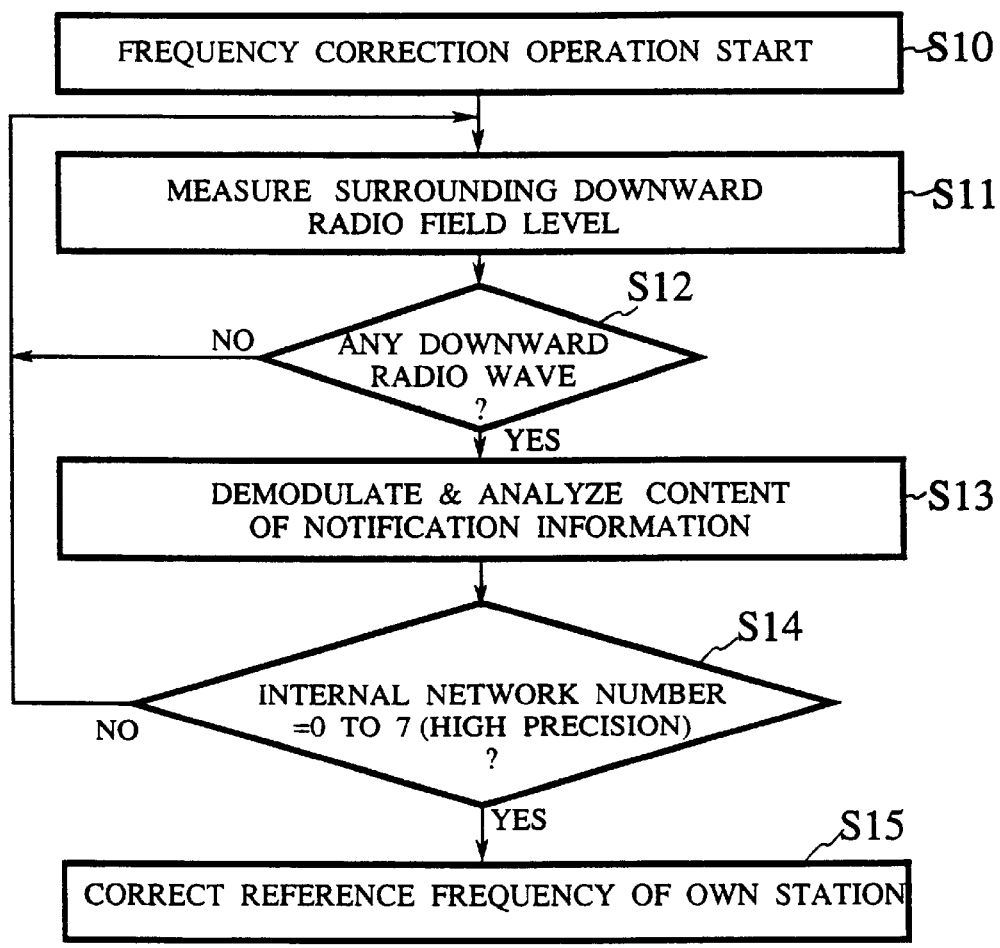
FIG. 10 is a flow chart for the operation of a low precision frequency base station in the mobile communication system shown in FIG. 6 at a time of using the notification information message format shown in FIG. 9.
Figure 11:
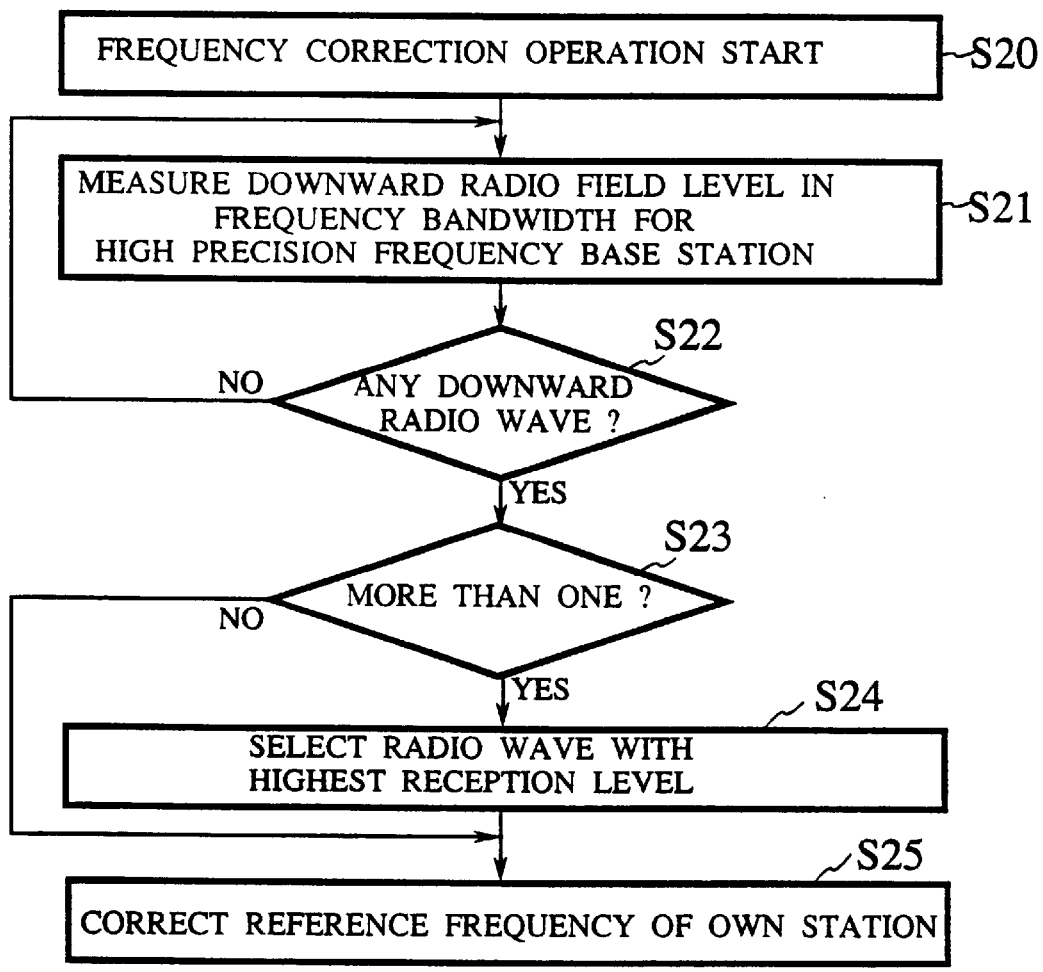
FIG. 11 is a flow chart for the operation of a low precision frequency base station in the mobile communication system shown in FIG. 6 at a time of using still another notification form.

Next, as a second concrete example, a use of a notification information message format as shown in FIG. 9 can be considered. In this case, the operation of the low precision frequency base station 61a in FIG. 6 proceeds according to the flow chart of FIG. 10 as follows.

After the start of the frequency correction operation (S10), the base station 61a carries out a measurement of a surrounding radio field level in the downward frequency bandwidth (S11), judges whether there is any downward radio wave or not (S12), and recognizes the existences of f2 and f4 from the obtained reception levels. Then, the notification information of the radio waves of each of these f2 and f4 is received and demodulated, and its content is analyzed (S13).

Here, in a case where the surrounding radio zones A and E are in the PDC scheme (based on the RCR STD-27), an operator sets an "internal network number" within a "network number" defined in the notification information as shown in FIG. 9 suitably as the high precision frequency base station or the low precision frequency base station, so that it becomes possible for the base station 61a to recognize that f4 is the radio waves transmitted from the high precision frequency base station 61e. For example, this "internal network number" is set suitably to 1 to 7 for the high precision frequency base station, or to 8 to 15 for the low precision frequency base station. Here, in FIG. 9, what is within ( ) indicates the content of each information element.

For this reason, the base station 61a judges whether the "internal network number" of each notification information is any of 1 to 7 or not (S14), and makes a correction of a reference frequency of own station according to the frequency which is judged as being in the high precision (S15).

The base station 61a, which has the frequency precision equivalent to the base station 61e as the frequency correction is made by this method, sets the "internal network number" within the notification information of the transmission waves of own station to any of 0 to 7 indicating the high precision.

Next, as a third concrete example, a case in which an operator of the mobile communication system operates the system by separating the transmission frequency bandwidths for the high precision frequency base station and the low precision frequency base station can be considered. For example, f1 and f4 are used as the frequency bandwidth for the high precision frequency base station and f2 and f3 are used as the frequency bandwidth for the low precision frequency base station. Each base station stores this frequency bandwidth separation in advance as an operating information. In this case, the operation of the low precision frequency base station 61a in FIG. 6 proceeds according to the flow chart of FIG. 11 as follows.

After the start of the frequency correction operation (S20), the base station 61a carries out a measurement of a downward radio field level for f1 and f4 which are the frequency bandwidth for the high precision frequency base station (S21), judges whether there is any downward radio wave in high precision or not (S22), and recognizes the existence of f4 from the obtained reception levels. Here, in a case there are a plurality of frequencies in high precision (S23 Yes), the radio wave with the highest reception level is selected (S24). Then, the base station 61a makes a correction of a reference frequency of own station according to the obtained frequency in high precision (S25).

The base station 61a, which has the frequency precision equivalent to the base station 61e as the frequency correction is made by this method, transmits the transmission waves of own station using the frequency in the frequency bandwidth for the high precision frequency base station, such as f1 for example.

Next, with references to FIG. 12 to FIG. 15, the fourth embodiment of the present invention will be described.

Figure 12:
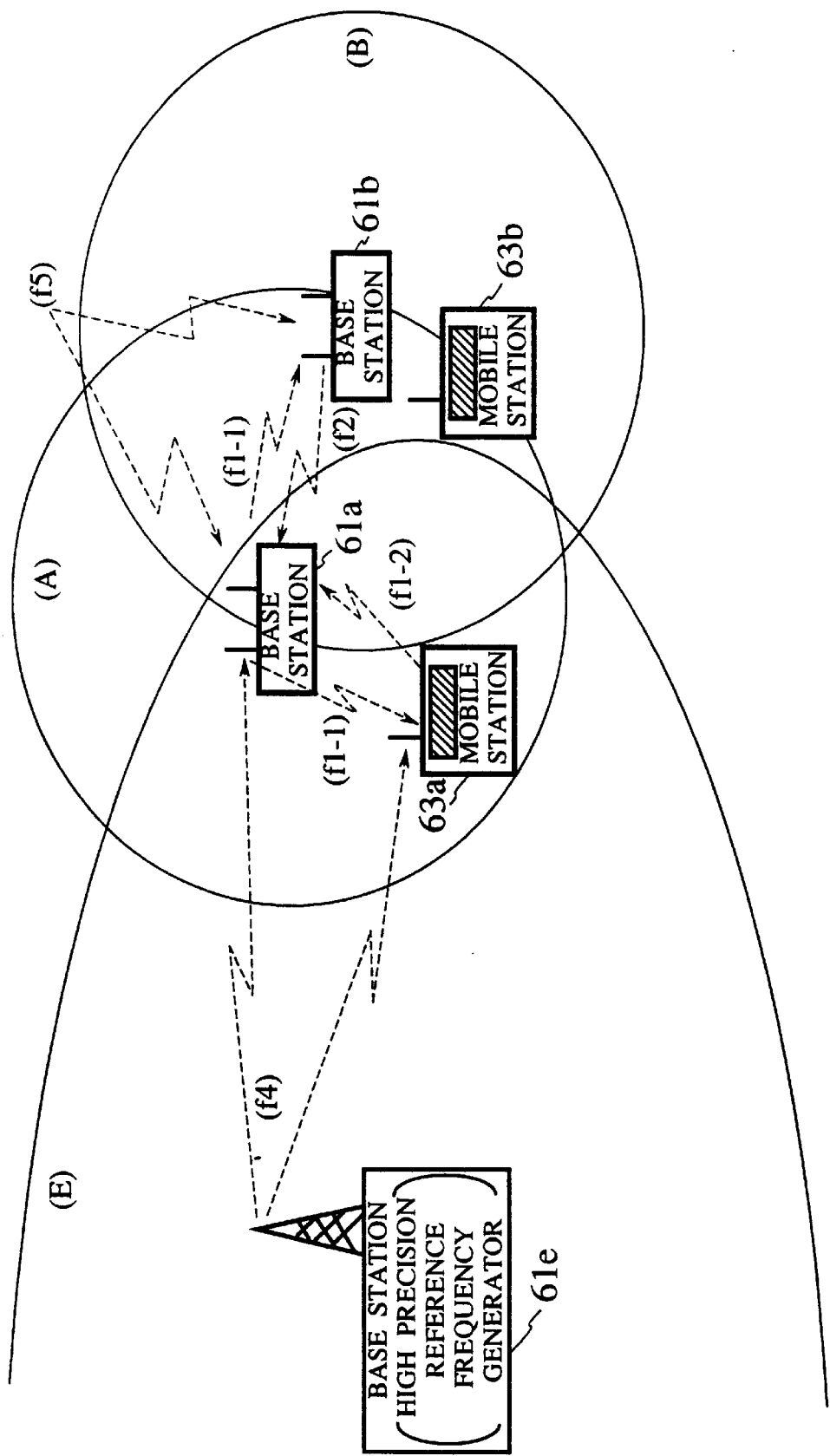
FIG. 12 is a schematic diagram of a mobile communication system for explaining a base station frequency correction scheme in a mobile communication system according to the fourth embodiment of the present invention.

FIG. 12 is a figure showing an overall configuration of a mobile communication system according to the fourth embodiment of the present invention. In FIG. 12, 61a and 61b are base stations without a high precision reference frequency generator, 61e is a base station with a high precision reference frequency generator, 63a and 63b are mobile stations located in areas of radio zones A and B, A, B, and E are radio zones of the base stations 61a, 61b and 61e, respectively, f1-1 and f1-2 are frequencies of transmission waves and reception waves of the base station 61a, respectively, f2 is a frequency of the transmission and reception waves of the base station 61b, f4 is a frequency of transmission waves of the base station 61e, and f5 indicates a frequency of unnecessary extraneous waves in the identical frequency bandwidth as the frequencies f1-1, f1-2, f2 and f4.

The base station 61a carries out a measurement of a surrounding radio field level of own station, and detects the existences of transmission waves or reception waves at the frequencies f2, f4 and f5 in the surrounding. Then, the base station 61a commands an analysis of the frequencies f2, f4 and f5 to the mobile station 63a which is located in an area of the radio zone A of own station.

According to this, the mobile station 63a receives and demodulates the respective frequencies, carries out an analysis of contents of these demodulated signals, recognizes that the frequency f2 is the transmission waves of a base station with a frequency not yet corrected in the identical system, the frequency f4 is the transmission waves of a base station having a high precision reference frequency generator, and the frequency f5 is the extraneous waves that cannot be analyzed, and notifies this analysis result to the base station 61a.

As a result, the base station 61a makes a correction of a reference frequency of own station with respect to this frequency f4, and transmits signals containing contents which are already frequency corrected.

Similarly, the base station 61b commands the analysis of the frequencies f-1 and f5 to the mobile station 63b, recognizes that the frequency f1-1 is already frequency corrected from the analysis result of the mobile station 63b, and makes a correction of a reference frequency of own station with respect to this frequency f1-1.

As a result, without requiring the base stations 61a and 61b to be equipped with the function to demodulate the base station transmission waves, the radio zones A and B have a uniform frequency precision without making an erroneous correction of a frequency due to the unnecessary extraneous waves f5, and the frequency precision with an absolute precision as high as the radio zone E is going to be established, so that it becomes possible for the mobile stations 63a and 63b to make quick and smooth zone transitions in the radio zones A and B while waiting for receiving a call or while in communication, without making a correction of a reference frequency to a corresponding base station frequency at each radio zone transition.

Here, in a case where the mobile stations 63a and 63b have a function and a right to be located in an area of the base station 61e, it also becomes possible to make a quick and smooth zone transition for the radio zone E while waiting for receiving a call or while in communication similarly as described above.

Also, at a time of constructing the service area of the radio zones A and B, it becomes possible to manufacture the base stations inexpensively, and due to the compactness of the base stations, it becomes possible to secure the locations to set them up. Moreover, a construction of the service area continuous to the radio zone E also becomes easy.

Note that, in this fourth embodiment, as a method for the low precision frequency base station to select a base station of a frequency correction target, the following concrete example can be considered.

Figure 13:
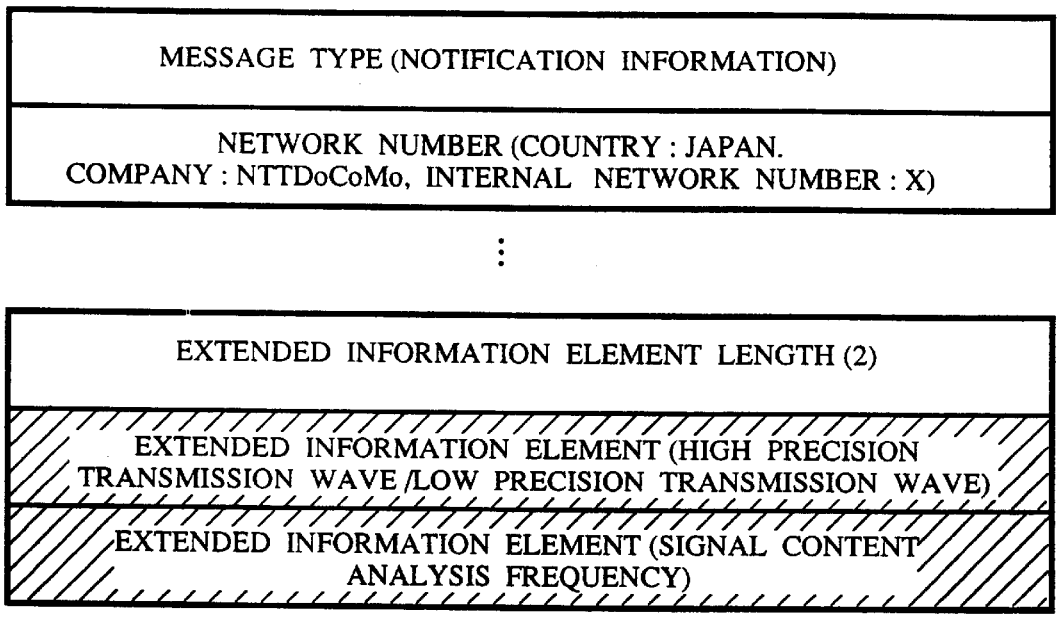
FIG. 13 is a figure showing one example of a notification information message format used in the mobile communication system shown in FIG. 12.
Figure 14:
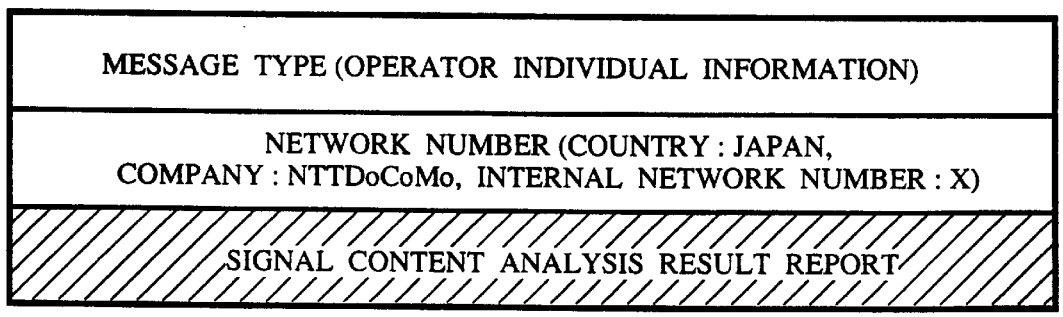
FIG. 14 is a figure showing one example of an operator individual information message format used in the mobile communication system shown in FIG. 12.

Namely, a use of a notification information message format as shown in FIG. 13 and an operator individual information message format as shown in FIG. 14 can be considered.

In the notification information message format of FIG. 13, in a case where the radio zones are in the PDC scheme (based on the RCR STD-27), similarly as the first concrete example of the third embodiment described above, each base station specifies the fact that the transmission frequency of own station is in high precision or in low precision, within an "extended information element" that is newly defined in the notification information of a control channel as "high precision transmission wave/low precision transmission wave bit". Also, in order to request an analysis of the notification information from the base station to the mobile station, an information element called "signal content analysis frequency" is newly defined within the notification information. On the other hand, in the operator individual information message format of FIG. 14, in order to report an analysis result of the notification information from the mobile station to the base station, a message called "signal content analysis result report" is newly defined as an operator individual information. Here, in FIG. 13 and FIG. 14, what is within ( ) indicates the content of each information element, and a shaded portion indicates a newly defined portion.

Figure 15:
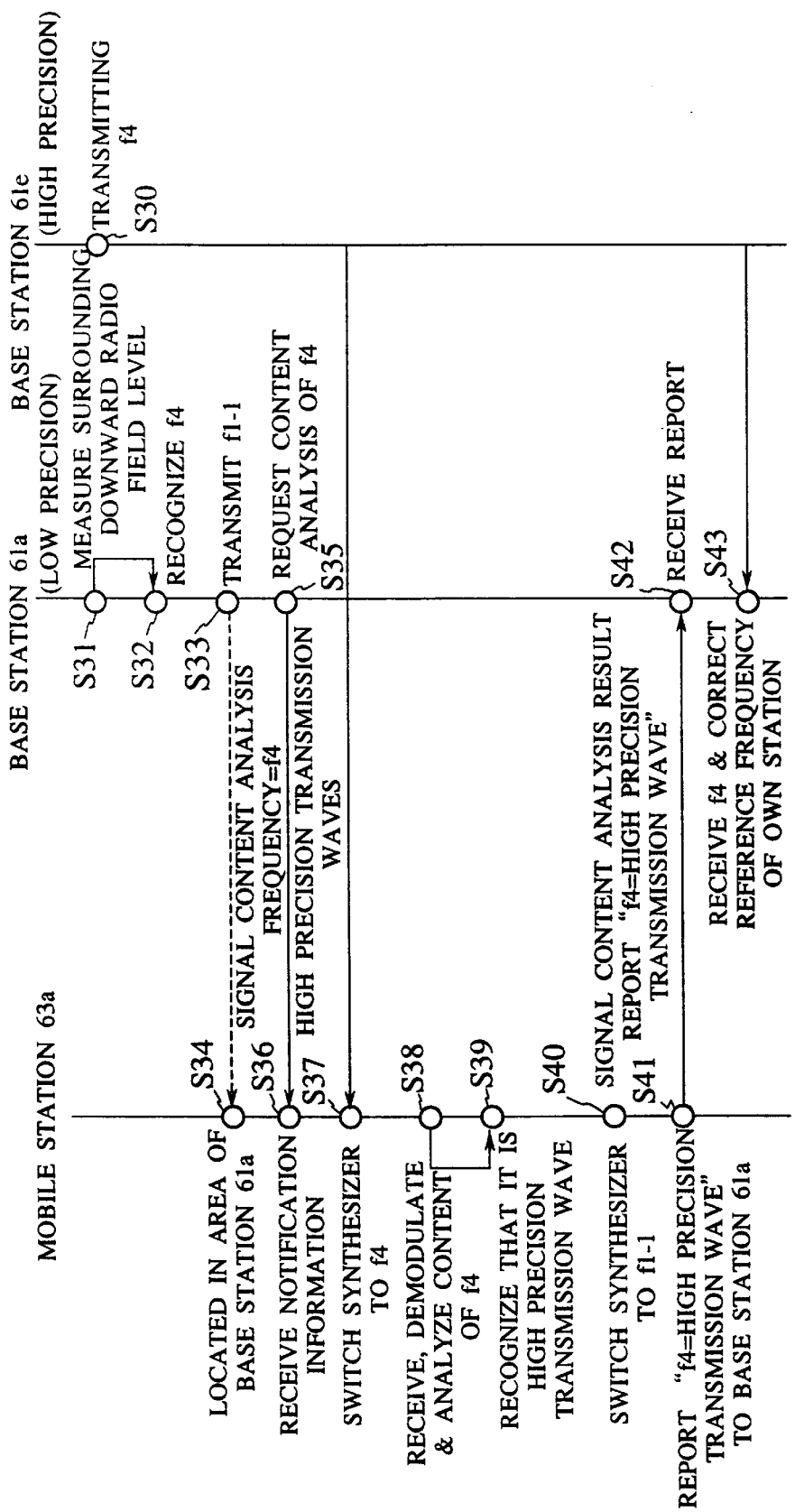
FIG. 15 is a sequential flow chart for the operation in the mobile communication system shown in FIG. 12 at a time of using the notification information message format shown in FIG. 13 and the operator individual information message format shown in FIG. 13.

In this case, the operations of the low precision frequency base station 61a, the high precision frequency base station 61e, and the mobile station 63a in FIG. 12 proceed according to the sequence flow chart of FIG. 15 as follows.

First, the base station 61e is transmitting in f4 (S30). Here, the base station 61a carries out a measurement of a surrounding downward radio field level (S31), and recognizes the existence of f4 from the obtained reception level.

Then, the base station 61a starts the transmission in f1-1 to form the radio zone A (S33), and the mobile station 63a recognizes the radio zone A by receiving f1-1, and located itself in that area (S34). Next, the base station 61a notifies the content analysis request for the recognized f4 by means of the "signal content analysis frequency" message of the notification information (S35).

The mobile station 63a which received this notification information (S36) recognizes that the frequency code for f4 is stored in the "signal content analysis frequency", switches the frequency synthesizer of own station to f4 (S37), receives and demodulates f4 from the base station 61e, and analyze its content (S38). As a result, when f4 is recognized as the high precision transmission waves (S39), the mobile station 63a switches the frequency synthesizer of own station to f1-1 (S40), and reports the analysis result that f4 is the high precision transmission waves to the base station 61a by means of the "signal content analysis result report" message of the upward control signal (SCCH) (S41).

The base station 61a which received this report (S42) receives f4 from the base station 61e, and makes a correction of a reference frequency of own station according to this (S43).

Next, with references to FIG. 16 to FIG. 17, the fifth embodiment of the present invention will be described.

Figure 16:
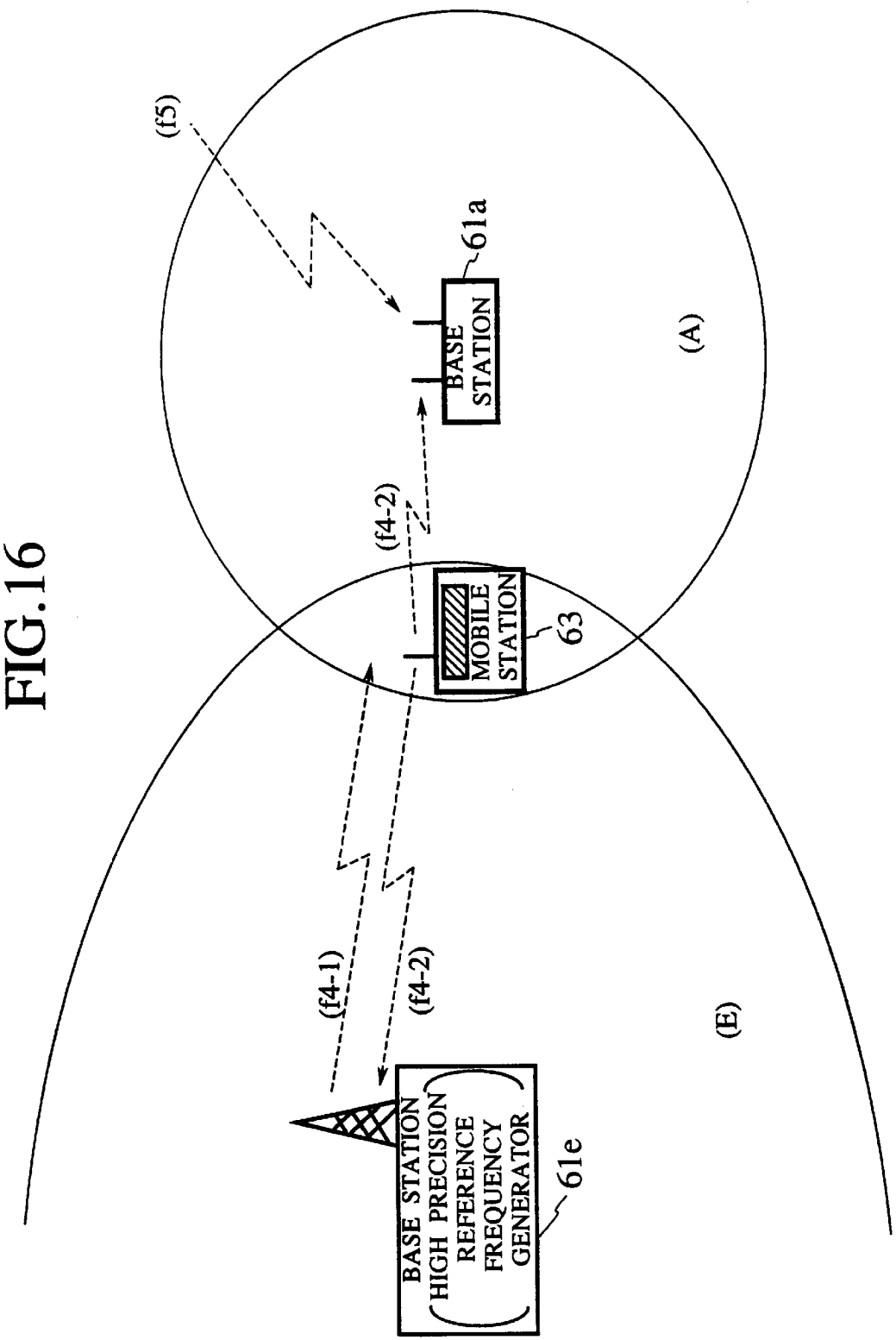
FIG. 16 is a schematic diagram of a mobile communication system for explaining a base station frequency correction scheme in a mobile communication system according to the fifth embodiment of the present invention.

FIG. 16 is a figure showing an overall configuration of a mobile communication system according to the fifth embodiment of the present invention. In FIG. 16, 61a is a base station without a high precision reference frequency generator, 61e is a base station with a high precision reference frequency generator, 63 is a mobile station currently located in an area of a radio zone E and communicating with the base station 61e, A and E are radio zones of the base stations 61a and 61e, respectively, f4-1 is a frequency of transmission waves from the base station 61e to the mobile station 63, f4-2 is a frequency of transmission waves from the mobile station 63 to the base station 61e, and f5 indicates a frequency of unnecessary extraneous waves in the identical frequency bandwidth as the frequencies f4-1 and f4-2.

The base station 61a carries out a measurement of a surrounding radio field level in a reception frequency bandwidth of own station, and detects the existences of transmission waves at the frequencies f4-2 and f5 in the surrounding. Then, the base station 61a carries out an analysis of the signal contents of the frequencies f4-2 and f5, recognizes that the frequency f4-2 is the transmission waves used by the mobile station 63 for a communication and its communicating partner is the base station 61e having a high precision reference frequency generator, and the frequency f5 is the extraneous waves that cannot be analyzed. Then, the base station 61a makes a correction of a reference frequency of own station with respect to the frequency f4-2, and transmits signals containing contents which are already frequency corrected by the base station transmission waves of own station.

As a result, it becomes possible for the base station 61a to make a frequency correction of own station with respect to a frequency of another base station, without being required to be equipped with the function to demodulate the base station transmission waves, even under an environment in which the transmission waves of that another base station cannot be received directly as this base station 61a is set up outside of the radio zone of that another base station. By means of this, it becomes easy to make the station positioning design (the study of a number of base stations, a base station transmission power, a frequency used by each base station, etc. as factors for determining a traffic, a size of radio zone, etc., in a case of setting up a base station), to secure the set up location, etc., for the base station 61a.

Also, in this fifth embodiment, the communication partner of the mobile station 63 is assumed to be the base station 61e having a high precision reference frequency generator, but it is similar even when this is the base station which is already frequency corrected. In addition, even when the radio zones A and E are discontinuous, the similar effect can be obtained as long as it is within a range in which the transmission waves in the frequency f4-2 of the mobile station 63 reach to the base station 61a, and it becomes possible to set the frequency precision of the base station 61a in accordance with the base station 61e. By means of this, in a case where the mobile station 63 makes a transition from the radio zone E to the radio zone A, the mobile station 63 becomes capable of being located in an area of the radio zone A in short time, without newly making a correction of a reference frequency of own station to a frequency of the base station 61a in order to receive control signals.

Note that, in this fifth embodiment, as a method for the low precision frequency base station to monitor the upward radio waves of the mobile station in communication, and correct a reference frequency of own station, the following concrete example can be considered.

Figure 17:
FIG. 17 is a figure showing one example of a structure of an upward communication channel used in the mobile communication system shown in FIG. 16.

Namely, in a case where the radio zones of the high precision frequency base station and the low precision frequency base station are in the PDC scheme (based on the RCR STD-27), it is possible to consider a scheme in which the operator of the mobile communication system operates the system by using color codes of the communication channel as shown in FIG. 17 separately for the high precision frequency base station and for the low precision frequency base station. For example, 1 to 128 (Decimal) are used as the color codes for the high precision frequency base station, and 129 to 255 (Decimal) are used as the color codes for the low precision frequency base station. Here, in FIG. 17, a shaded portion indicates a scrambled portion.

In this case, the operation of the low precision frequency base station 61a in FIG. 16 proceeds as follows.

The base station 61a carries out a measurement of a surrounding upward radio field level, and recognizes the existence of the upward radio waves of the mobile station in communication with another base station. Then, it receives and demodulates these upward radio waves, and analyzes their content to obtain the color code.

Then, the base station 61a judges that these upward radio waves are the transmission waves of the mobile station 63 in communication with the high precision frequency base station 61e by judging whether the obtained color code is within a range of 1 to 128 or not, and makes a correction of a reference frequency of own station according to the frequency of these mobile station transmission waves.

Next, with reference to FIG. 18, the sixth embodiment of the present invention will be described.

This sixth embodiment is an example in which the base station frequency correction scheme in the mobile communication system of the present invention is applied a case of constructing a service area by setting up a plurality of low precision frequency base stations at a place such as an underground street or an interior of a building where the radio waves from an external high precision frequency base station do not reach.

Figure 18:
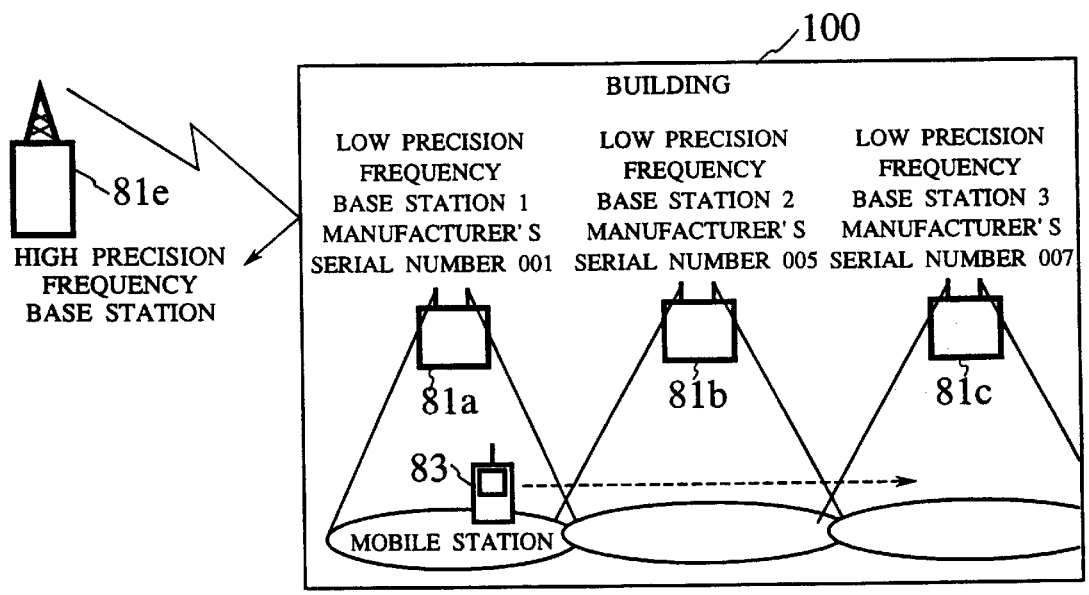
FIG. 18 is a schematic diagram of a mobile communication system for explaining a base station frequency correction scheme in a mobile communication system according to the sixth embodiment of the present invention.

In this case, as shown in FIG. 18, low precision frequency base stations 81a, 81b and 81c are set up inside a building 100 to which the radio waves from an external high precision frequency base station 81e do not reach, and a communication with a mobile station 83 is made inside this building 100. Here, the low precision frequency base stations 81a, 81b and 81c form a radio zone in the PDC scheme, and each low precision frequency base station stores a unique manufacturer's serial number information in a memory (not shown). These low precision frequency base stations 81a, 81b and 81c are set up such that their manufacturer's serial numbers are arranged in an order of values, as in 001, 005 and 007, with respect to the base stations 81a, 81b and 81c with consecutive radio zones.

Each low precision frequency base station transmits by storing the manufacturer's serial number of own station in an extended information element called "own station manufacturer's serial number information" newly defined within the notification information.

On the other hand, each low precision frequency base station obtains the manufacturer's serial numbers of the surrounding low precision frequency base stations from the notification information of the surrounding low precision frequency base stations, by means of a measurement of a surrounding downward radio field level and reception, demodulation, and content analysis of the notification information, compares the obtained manufacturer's serial number with the manufacturer's serial number of own station, selects the base station with the manufacturer's serial number smaller than that of own station, and makes a correction of a reference frequency of own station according to transmission waves of that base station.

As each low precision frequency base station carries out such an operation regularly, it is possible to make a uniform reference frequency precision for the base stations 81a, 81b and 81c inside the building 100.

Here, in a case a reference frequency precision of each low precision frequency base station is deviating by $+(1\times 10^{-6})$ with respect to the absolute frequency precision, when the mobile station 83 is to be located in an area of the radio zone of the base station 81a by entering inside the building 100 from the outside or turning its power on inside the building 100, there is a need for a frequency drawing operation (an operation to shift the reception frequency of own station minutely in order to receive transmission waves emitted from a transmission source with a frequency precision different from that of own station, so as to make it possible to receive the transmission waves), and it requires several seconds of time until the mobile station 83 is set in a state capable of being located in that area. At this point, the mobile station 83 has the reference frequency precision of own station at a timing of being located in an area of the radio zone of the base station 81a equal to $+(1\times 10^{-6})$.

After that, in a case where the mobile station 83 makes a transition to the radio zone of the neighboring base station 81b, because the frequency precision in the radio zone of the base station 81b is already set equal to $+(1\times 10^{-6})$, it is possible for the mobile station 83 to be located in an area of the radio zone of the base station 81b without carrying out the frequency drawing operation. Consequently, it becomes possible to carry out the zone transition and the handover in short time.

In this manner, in an environment such as the interior of the building or the underground street, even in a case where the base station frequency precision is deviating from the absolute frequency precision, it is possible to obtain a useful effect by relatively adjusting the frequency precision among the base stations.

As described above, according to the present invention, each base station corrects a reference frequency of own station with respect to the high precision reference frequency or the already frequency corrected transmission waves according to the content of the reception waves, the recognition result from the mobile station, or the recognition result of the transmission waves of the mobile station in communication with another base station, so that there is no need for having an expensive and large sized high precision frequency generator, and it becomes possible to construct a high quality and economical mobile communication service area using inexpensive and compact base station devices. Therefore, it is effective in realizing the mobile communication system such as an automobile telephone system or a cordless telephone system using micro-cells or pico-cells for which many base station equipments are necessary in order to secure the service area. Also, the frequency precision in the mobile communication service area as a whole is improved as well as made uniform, so that it becomes possible for the mobile station to make a quick and smooth radio zone transition while waiting for receiving a call or while in communication.

We claim:

1. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized by having:

a high precision frequency base station device having a high precision frequency generator;

a mobile station device for a mobile station which receives the transmission waves from said high precision frequency base station device using the transmission frequency in a prescribed frequency precision, controls a reference frequency to be a reference for transmission and reception frequencies of own station in accordance with the frequency precision of the received transmission waves, and carries out transmission and reception with respect to a base station using transmission and reception frequencies according to the controlled reference frequency; and a low precision frequency base station device having a low precision frequency generator other than said high precision frequency base station device, which receives the transmission waves from the mobile station device carrying out transmission and reception using the transmission and reception frequencies according to the controlled reference frequency, controls a reference frequency to be a reference for transmission and reception frequencies of own station in accordance with the frequency precision of the received transmission waves, and carries out transmission and reception with respect to the mobile station using transmission and reception frequencies according to the controlled reference frequency.

2. The mobile communication system as described in claim 1, characterized in that said mobile station device has buffer means for storing a control value required in correcting the reference frequency of own station in accordance with the frequency precision of the transmission waves from said high precision frequency base station device, and control means for controlling the reference frequency of own station according to the control value stored by the buffer means.

3. The mobile communication system as described in claim 2, characterized in that said mobile station device has additional buffer means for storing an additional control value required in correcting the reference frequency of own station in accordance with the frequency precision of the transmission waves from said low precision frequency base station device, and said control means controls the reference frequency of own station according to the control value stored by said buffer means, after making that mobile station device capable of communicating with said low precision frequency base station device by controlling the reference frequency of own station according to the additional control value stored by the additional buffer means.

4. The mobile communication system as described in claim 1, characterized in that said high precision frequency base station device transmits the transmission waves which contain a frequency precision information indicating that the frequency precision of the transmission frequency is a high precision, said mobile station device judges that the received transmission waves are in a high precision frequency from the frequency precision information contained in the transmission waves from said high precision frequency base station device, and transmits the transmission waves which contain a frequency precision information indicating that the frequency precision of the transmission frequency is a high precision after the reference frequency of own station is controlled in accordance with the frequency precision of the received transmission waves, and said low precision frequency base station device judges that the received transmission waves are in a high precision frequency from the frequency precision information contained in the transmission waves from said mobile station device, and controls the reference frequency of own station in accordance with the frequency precision of the received transmission waves.

5. A mobile station device for a mobile station in a mobile communication system formed by a plurality of base stations with not always uniform transmission and reception frequency precision for forming a plurality of radio zones, and a mobile station for making communications via said plurality of base stations while moving within said plurality of radio zones, the mobile station device characterized by having:

means for receiving transmission waves from a base station, and judging that the received transmission waves are in a high precision frequency;

means for controlling a reference frequency to be a reference for transmission and reception frequencies of own station in accordance with the frequency precision of the transmission waves received by said receiving and judging means; and transmission and reception means for carrying out transmission and reception with respect to a base station using the transmission and reception frequencies according to the reference frequency controlled by said controlling means.

6. The mobile station device as described in claim 5, characterized in that said controlling means has buffer means for storing a control value required in correcting the reference frequency of own station in accordance with the frequency precision of said transmission waves in a high precision frequency, and controls the reference frequency of own station according to the control value stored by the buffer means.

7. The mobile station device as described in claim 6, characterized in that said controlling means has additional buffer means for storing an additional control value required in correcting the reference frequency of own station in accordance with the frequency precision of the received transmission waves other than said transmission waves in a high precision frequency, and controls the reference frequency of own station according to the control value stored by said buffer means, after controlling the reference frequency of own station according to the additional control value stored by the additional buffer means.

8. The mobile station device as described in claim 5, characterized in that said transmission and reception means transmits the transmission waves which contain a frequency precision information indicating that the frequency precision of the transmission frequency is a high precision after said controlling means controlled the reference frequency of own station in accordance with the frequency precision of the received transmission waves.

9. A base station device for each base station in a mobile communication system formed by a plurality of base stations with not always uniform transmission and reception frequency precision for forming a plurality of radio zones, and a mobile station for making communications via said plurality of base stations while moving within said plurality of radio zones, the base station device characterized by having:
  means for receiving transmission waves from a mobile station, and judging that the received transmission waves are in a high precision frequency according to a reference frequency controlled with respect to a high precision frequency base station device having a high precision frequency generator;
  means for controlling a reference frequency to be a reference for transmission and reception frequencies of own station in accordance with the frequency precision of the transmission waves received by said receiving and judging means; and
  transmission and reception means for carrying out transmission and reception with respect to a mobile station using the transmission and reception frequencies according to the reference frequency controlled by said controlling means.

10. The base station device as described in claim 9, characterized in that said controlling means has buffer means for storing a control value required in correcting the reference frequency of own station in accordance with the frequency precision of the transmission waves from said mobile station, and controls the reference frequency of own station according to the control value stored by the buffer means.

11. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that:
  a base station device for each base station has:
    reception means for receiving transmission waves from another base station using a transmission frequency in a prescribed frequency precision, and judging that the received transmission waves are in a high precision frequency according to a reference frequency controlled with respect to a high precision frequency base station device having a high precision frequency generator, from a frequency precision information contained in the received transmission waves;
    frequency control means for controlling a reference frequency to be a reference for transmission and reception frequencies of own station in accordance with the frequency precision of the transmission waves received by said reception means, when the reception means judged that the received transmission waves are in a high precision frequency; and
    transmission means for transmitting transmission waves which contain a frequency precision information indicating that a frequency precision of a transmission frequency is a high precision, using the transmission frequency according to the reference frequency controlled by said frequency control means, after the frequency control means controlled the reference frequency of own station in accordance with the frequency precision of the transmission waves received by said reception waves.

12. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that:
  a base station device for each base station has:
    reception means for detecting presence/absence of transmission waves from another base station, and notifying a transmission frequency of the detected transmission waves to a mobile station located in a radio zone of own station, to make the mobile station to recognize whether the detected transmission waves is in a high precision frequency and return a recognition result;
    frequency control means for controlling a reference frequency to be a reference for transmission and reception frequencies of own station in accordance with the frequency precision of the detected transmission waves, when the recognition result returned from the mobile station indicates that the detected transmission waves are in a high precision frequency; and
    transmission means for transmitting transmission waves which contain a frequency precision information indicating that a frequency precision of a transmission frequency is a high precision, using the transmission frequency according to the reference frequency controlled by said frequency control means, after the frequency control means controlled the reference frequency of own station in accordance with the frequency precision of the detected transmission waves; and
  a mobile station device for a mobile station has:
    recognition means for receiving the transmission waves using the transmission frequency notified from said reception means of the base station of a currently located area, and recognizing whether the received transmission waves are in a high precision frequency from the frequency precision information contained in the received transmission waves; and
    recognition result returning means for returning the recognition result obtained by the recognition means to the base station of a currently located area.

13. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that:
  a base station device for each base station has:
    recognition means for detecting presence/absence of transmission waves of a mobile station currently in communication with another base station, and recognizing whether the detected transmission waves are in a high precision frequency from a frequency precision information contained in the detected transmission waves; and frequency control means for controlling a reference frequency to be a reference for transmission and reception frequencies of own station in accordance with the frequency precision of the detected transmission waves, when the recognition means recognized that the detected transmission waves are in a high precision frequency.

14. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having:

a step of transmitting transmission waves using a transmission frequency in a prescribed frequency precision from a high precision frequency base station device having a high precision frequency generator;

a step of receiving the transmission waves from said high precision frequency base station device, controlling a reference frequency to be a reference for transmission and reception frequencies of own station in accordance with the frequency precision of the received transmission waves, and carrying out transmission and reception with respect to a base station using transmission and reception frequencies according to the controlled reference frequency, at a mobile station device for a mobile station; and a step of receiving the transmission waves from the mobile station device carrying out transmission and reception using the transmission and reception frequencies according to the controlled reference frequency, controlling a reference frequency to be a reference for transmission and reception frequencies of own station in accordance with the frequency precision of the received transmission waves, and carrying out transmission and reception with respect to the mobile station using transmission and reception frequencies according to the controlled reference frequency, at a low precision frequency base station device having a low precision frequency generator other than said high precision frequency base station device.

15. The mobile communication scheme as described in claim 14, characterized in that said mobile station device stores a control value required in correcting the reference frequency of own station in accordance with the frequency precision of the transmission waves from said high precision frequency base station device at buffer means, and controls the reference frequency of own station according to the control value stored by the buffer means.

16. The mobile communication scheme as described in claim 14, characterized in that said mobile station device stores an additional control value required in correcting the reference frequency of own station in accordance with the frequency precision of the transmission waves from said low precision frequency base station device at additional buffer means, and controls the reference frequency of own station according to the control value stored by said buffer means, after making that mobile station device capable of communicating with said low precision frequency base station device by controlling the reference frequency of own station according to the additional control value stored by the additional buffer means.

17. The mobile communication scheme as described in claim 14, characterized in that said high precision frequency base station device transmits the transmission waves which contain a frequency precision information indicating that the frequency precision of the transmission frequency is a high precision, said mobile station device judges that the received transmission waves are in a high precision frequency from the frequency precision information contained in the transmission waves from said high precision frequency base station device, and transmits the transmission waves which contain a frequency precision information indicating that the frequency precision of the transmission frequency is a high precision after the reference frequency of own station is controlled in accordance with the frequency precision of the received transmission waves, and said low precision frequency base station device judges that the received transmission waves are in a high precision frequency from the frequency precision information contained in the transmission waves from said mobile station device, and controls the reference frequency of own station in accordance with the frequency precision of the received transmission waves.

18. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having:

a step of receiving transmission waves from another base station using a transmission frequency in a prescribed frequency precision, and judging that the received transmission waves are in a high precision frequency according to a reference frequency controlled with respect to a high precision frequency base station device having a high precision frequency generator, from a frequency precision information contained in the received transmission waves, at a base station device for each base station;

a step of controlling a reference frequency to be a reference for transmission and reception frequencies of own station in accordance with the frequency precision of the received transmission waves, at a base station device for each base station, when the receiving and judging step judged that the received transmission waves are in a high precision frequency; and a step of transmitting transmission waves which contain a frequency precision information indicating that a frequency precision of a transmission frequency is a high precision, using the transmission frequency according to the reference frequency controlled by said controlling step, at a base station device for each base station, after the controlling step controlled the reference frequency of own station in accordance with the frequency precision of the received transmission waves.

19. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having:

a step of detecting presence/absence of transmission waves from another base station, and notifying a transmission frequency of the detected transmission waves to a mobile station located in a radio zone of own station, at a base station device for each base station;

a step of receiving the transmission waves using the transmission frequency notified from the base station of a currently located area at the detecting and notifying step, and recognizing whether the received transmission waves are in a high precision frequency from the frequency precision information contained in the received transmission waves, at a mobile station device for a mobile station;

a step of returning a recognition result obtained by the receiving and recognizing step to the base station of a currently located area, at a mobile station device for a mobile station;

a step of controlling a reference frequency to be a reference for transmission and reception frequencies of own station in accordance with the frequency precision of the detected transmission waves, at a base station device for each base station, when the recognition result returned from the mobile station at the returning step indicates that the detected transmission waves are in a high precision frequency; and a step of transmitting transmission waves which contain a frequency precision information indicating that a frequency precision of a transmission frequency is a high precision, using the transmission frequency according to the reference frequency controlled by said controlling step, at a base station device for each base station, after said controlling step controlled the reference frequency in accordance with the frequency precision of the detected transmission waves.

20. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having:

a step of detecting presence/absence of transmission waves of a mobile station currently in communication with another base station, and recognizing whether the detected transmission waves are in a high precision frequency from a frequency precision information contained in the detected transmission waves, at a base station device of each base station; and a step of controlling a reference frequency to be a reference for transmission and reception frequencies of own station in accordance with the frequency precision of the detected transmission waves, at a base station device of each base station, when the detecting and recognizing step recognized that the detected transmission waves are in a high precision frequency.

21. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that:

said plurality of base stations are in a prescribed ordered relationship and having means for mutually notifying an information indicating the prescribed ordered relationship and each base station comprises a base station device which receives transmission waves from another base station device, judges whether or not the received transmission waves are in a high precision frequency according to a reference frequency controlled with respect to a high precision frequency base station device having a high precision frequency generator according to said prescribed ordered relationship, and carries out transmission and reception by controlling transmission and reception frequencies of own station in accordance with the frequency precision of the received transmission waves in a case of judging that the received transmission waves are in a high precision frequency.

22. A base station device for each base station in a mobile communication system formed by a plurality of base stations with not always uniform transmission and reception frequency precision for forming a plurality of radio zones, and a mobile station for making communications via said plurality of base stations while moving within said plurality of radio zones, where said plurality of base stations are in a prescribed ordered relationship and having means for mutually communicating an information indicating the prescribed ordered relationship, the base station device characterized by having:

reception means for receiving transmission waves from another base station device;

frequency control means for judging whether or not the received transmission waves are in a high precision frequency according to a reference frequency controlled with respect to a high precision frequency base station device having a high precision frequency generator according to said prescribed ordered relationship, and controlling transmission and reception frequencies of own station in accordance with the frequency precision of the transmission waves received by said reception means in a case of judging that the received transmission waves are in a high precision frequency; and a transmission and reception device for carrying out transmission and reception using the transmission and reception frequencies controlled by said frequency control means.

23. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized by having:

a mobile station device for a mobile station which receives transmission waves from one of said plurality of base stations, controls a reference frequency to be a reference for transmission and reception frequencies of own station in accordance with a frequency precision of the received transmission waves, and carries out transmission and reception with respect to a base station using the transmission and reception frequencies according to the controlled reference frequency; and a base station device which receives the transmission waves from the mobile station device carrying out transmission and reception using the transmission and reception frequencies according to the controlled reference frequency, controls a reference frequency to be a reference for transmission and reception frequencies of own station in accordance with the frequency precision of the received transmission waves, and carries out transmission and reception with respect to the mobile station using the transmission and reception frequencies according to the controlled reference frequency.

24. The mobile communication system as described in claim 23, characterized in that said plurality of base stations are in a prescribed ordered relationship, said mobile station device for a mobile station transmits the transmission waves which contain that the transmission waves of own station are those in which the reference frequency is controlled with respect to a certain base station and an information indicating said prescribed ordered relationship, and the base station device for each base station judges whether or not to make a frequency correction according to said prescribed ordered relationship, and controls the reference frequency when the frequency correction is judged to be made.

25. A base station device for each base station in a mobile communication system formed by a plurality of base stations with not always uniform transmission and reception frequency precision for forming a plurality of radio zones, and a mobile station for making communications via said plurality of base stations while moving within said plurality of radio zones, the base station device characterized by having:
   means for receiving transmission waves from a mobile station, and judging that the received transmission waves are according to a reference frequency controlled with respect to one of said plurality of base stations;
   means for controlling a reference frequency to be a reference for transmission and reception frequencies of own station in accordance with a frequency precision of the transmission waves received by said receiving and judging means; and
   transmission and reception means for carrying out transmission and reception with respect to a mobile station using the transmission and reception frequencies according to the reference frequency controlled by said controlling means.

26. The base station device as described in claim 25, characterized in that said plurality of base stations are in a prescribed ordered relationship, said mobile station transmits the transmission waves which contain that the transmission waves of own station are those in which the reference frequency is controlled with respect to a certain base station and an information indicating said prescribed ordered relationship, and the base station device for each base station further judges whether or not to make a frequency correction according to said prescribed ordered relationship at said receiving and judging means, and controls the reference frequency at said controlling means when the frequency correction is judged to be made.

27. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that:
   a base station device for each base station has:
      reception means for receiving transmission waves from another base station, and judging that the received transmission waves are already frequency corrected according to a reference frequency controlled with respect to a high precision frequency base station device having a high precision frequency generator, from a frequency precision information contained in the received transmission waves;
      frequency control means for controlling a reference frequency to be a reference for transmission and reception frequencies of own station in accordance with the frequency precision of the transmission waves received by said reception means, when the reception means judged that the received transmission waves are already frequency corrected; and
      transmission means for transmitting transmission waves which contain a frequency precision information indicating that a frequency precision of a transmission frequency is already frequency corrected, using the transmission frequency according to the reference frequency controlled by said frequency control means, after the frequency control means controlled the reference frequency of own station in accordance with the frequency precision of the transmission waves received by said reception means.

28. The mobile communication system as described in claim 27, characterized in that said plurality of base stations are in a prescribed ordered relationship and having means for mutually notifying an information indicating the prescribed ordered relationship, and the base station device for each base station further judges whether or not to make a frequency correction according to said prescribed ordered relationship at said reception means, and controls the reference frequency at said frequency control means when the frequency correction is judged to be made.

29. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that:
   a base station device for each base station has:
      reception means for detecting presence/absence of transmission waves from another base station, and notifying a transmission frequency of the detected transmission waves to a mobile station located in a radio zone of own station, to make the mobile station to recognize whether the detected transmission waves is already frequency corrected and return a recognition result;
      frequency control means for controlling a reference frequency to be a reference for transmission and reception frequencies of own station in accordance with the frequency precision of the detected transmission waves, when the recognition result returned from the mobile station indicates that the detected transmission waves are already frequency corrected; and
      transmission means for transmitting transmission waves which contain a frequency precision information indicating that a frequency precision of a transmission frequency is already frequency corrected, using the transmission frequency according to the reference frequency controlled by said frequency control means, after the frequency control means controlled the reference frequency of own station in accordance with the frequency precision of the detected transmission waves; and
   a mobile station device for a mobile station has:
      recognition means for receiving the transmission waves using the transmission frequency notified from said reception means of the base station of a currently located area, and recognizing whether the received transmission waves are already frequency corrected from the frequency precision information contained in the received transmission waves; and recognition result returning means for returning the recognition result obtained by the recognition means to the base station of a currently located area.

30. The mobile communication system as described in claim 29, characterized in that said plurality of base stations are in a prescribed ordered relationship, said mobile station device for a mobile station further judges whether or not to make a frequency correction at a base station of a currently located area according to said prescribed ordered relationship at said recognition means, and the base station device for each base station controls the reference frequency at said frequency control means when the recognition result returned from said mobile station indicates that the frequency correction should be made.

31. A mobile communication system formed by a plurality of base stations with not always uniform transmission and reception frequency precision for forming a plurality of radio zones, and a mobile station for making communications via said plurality of base stations while moving within said plurality of radio zones, the mobile communication system characterized in that:

a base station device for each base station has:

recognition means for detecting presence/absence of transmission waves of a mobile station currently in communication with another base station, and recognizing whether the detected transmission waves are already frequency corrected from a frequency precision information contained in the detected transmission waves; and frequency control means for controlling a reference frequency to be a reference for transmission and reception frequencies of own station in accordance with the frequency precision of the detected transmission waves, when the recognition means recognized that the detected transmission waves are already frequency corrected.

32. The mobile communication system as described in claim 31, characterized in that said plurality of base stations are in a prescribed ordered relationship, said mobile station transmits the transmission waves which contain a frequency precision information and an information indicating said prescribed ordered relationship regarding said another base station currently in communication, and the base station device for each base station further judges whether or not to make a frequency correction according to said prescribed ordered relationship at said recognition means, and controls the reference frequency at said frequency control means when the frequency correction is judged to be made.

33. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, where said plurality of base stations are in a prescribed ordered relationship and having means for mutually notifying an information indicating the prescribed ordered relationship, the mobile communication scheme characterized by having:

a step of receiving transmission waves from another base station device, at a base station device for each base station; and a step of judging whether or not the received transmission waves are in a high precision frequency according to a reference frequency controlled with respect to a high precision frequency base station device having a high precision frequency generator according to said prescribed ordered relationship, and carries out transmission and reception by controlling transmission and reception frequencies of own station in accordance with the frequency precision of the received transmission waves in a case of judging that the received transmission waves are in high precision frequency, at a base station device for each base station.

34. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having:

a step of receiving transmission waves from a base station device for one of said plurality of base stations, controlling a reference frequency to be a reference for transmission and reception frequencies of own station in accordance with a frequency precision of the received transmission waves, and carrying out transmission and reception with respect to a base station using the transmission and reception frequencies according to the controlled reference frequency, at a mobile station device for a mobile station; and a step of receiving the transmission waves from the mobile station device carrying out transmission and reception using the transmission and reception frequencies according to the controlled reference frequency, controlling a reference frequency to be a reference for transmission and reception frequencies of own station in accordance with the frequency precision of the received transmission waves, and carrying out transmission and reception with respect to the mobile station using the transmission and reception frequencies according to the controlled reference frequency, at a base station device for each base station.

35. The mobile communication scheme as described in claim 34, characterized in that said plurality of base stations are in a prescribed ordered relationship, said mobile station device for a mobile station transmits the transmission waves which contain that the transmission waves of own station are those in which the reference frequency is controlled with respect to a certain base station and an information indicating said prescribed ordered relationship, and the base station device for each base station judges whether or not to make a frequency correction according to said prescribed ordered relationship, and controls the reference frequency when the frequency correction is judged to be made.

36. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having:

a step of receiving transmission waves from another base station, and judging that the received transmission waves are already frequency corrected according to a reference frequency controlled with respect to a high precision frequency base station device having a high precision frequency generator, from a frequency precision information contained in the received transmission waves, at a base station device for each base station;

a step of controlling a reference frequency to be a reference for transmission and reception frequencies of own station in accordance with the frequency precision of the received transmission waves, at a base station device for each base station, when the receiving and judging step judged that the received transmission waves are already frequency corrected; and a step of transmitting transmission waves which contain a frequency precision information indicating that a frequency precision of a transmission frequency is already frequency corrected, using the transmission frequency according to the reference frequency controlled at said controlling step, at a base station device for each base station, after the controlling step controlled the reference frequency of own station in accordance with the frequency precision of the received transmission waves.

37. The mobile communication scheme as described in claim 36, characterized in that said plurality of base stations are in a prescribed ordered relationship and having means for mutually notifying an information indicating the prescribed ordered relationship, and the base station device for each base station further judges whether or not to make a frequency correction according to said prescribed ordered relationship at said receiving and judging step, and controls the reference frequency at said controlling step when the frequency correction is judged to be made.

38. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having:

a step of detecting presence/absence of transmission waves from another base station, and notifying a transmission frequency of the detected transmission waves to a mobile station located in a radio zone of own station, at a base station device for each base station;

a step of receiving the transmission waves using the transmission frequency notified from the base station of a currently located area at the detecting and notifying step, and recognizing whether the received transmission waves are already frequency corrected from the frequency precision information contained in the received transmission waves, at a mobile station device for a mobile station;

a step of returning a recognition result obtained by the receiving and recognizing step to the base station of a currently located area, at a mobile station device for a mobile station;

a step of controlling a reference frequency to be a reference for transmission and reception frequencies of own station in accordance with the frequency precision of the detected transmission waves, at a base station device for each base station, when the recognition result returned from the mobile station at the returning step indicates that the detected transmission waves are already frequency corrected; and a step of transmitting transmission waves which contain a frequency precision information indicating that a frequency precision of a transmission frequency is already frequency corrected, using the transmission frequency according to the reference frequency controlled by said controlling step, at a base station device for each base station, after said controlling step controlled the reference frequency in accordance with the frequency precision of the detected transmission waves.

39. The mobile communication scheme as described in claim 38, characterized in that said plurality of base stations are in a prescribed ordered relationship, said mobile station device for a mobile station further judges whether or not to make a frequency correction at a base station of a currently located area according to said prescribed ordered relationship at said recognizing step, and the base station device for each base station controls the reference frequency at said controlling step when the recognition result returned from said mobile station indicates that the frequency correction should be made.

40. A mobile communication scheme in a mobile communication system formed by a plurality of base stations with not always uniform transmission and reception frequency precision for forming a plurality of radio zones, and a mobile station for making communications via said plurality of base stations while moving within said plurality of radio zones, the mobile communication scheme characterized by having:

a step of detecting presence/absence of transmission waves of a mobile station currently in communication with another base station, and recognizing whether the detected transmission waves are already frequency corrected from a frequency precision information contained in the detected transmission waves, at a base station device for each base station; and a step of controlling a reference frequency to be a reference for transmission and reception frequencies of own station in accordance with the frequency precision of the detected transmission waves, at a base station device of each base station, when the detecting and recognizing step recognized that the detected transmission waves are already frequency corrected.

41. The mobile communication scheme as described in claim 40, characterized in that said plurality of base stations are in a prescribed ordered relationship, said mobile station transmits the transmission waves which contain a frequency precision information and an information indicating said prescribed ordered relationship regarding said another base station currently in communication, and the base station device for each base station further judges whether or not to make a frequency correction according to said prescribed ordered relationship at said detecting and recognizing step, and controls the reference frequency at said controlling step when the frequency correction is judged to be made.

* * * * *

UNITED STATES PATENT AND TRADEMARK OFFICE
CERTIFICATE OF CORRECTION

PATENT NO. : 5,826,197
DATED : October 20, 1998
INVENTOR(S) : Kiyohito NAGATA et al.

It is certified that error appears in the above-identified patent and that said Letters Patent is hereby corrected as shown below:

On the Title page, Item [86], the PCT information should be:

-- [86] PCT No: PCT/JP95/01353

§371 Date: Mar. 6, 1996

§102(e)Date: Mar. 6, 1996 --

Signed and Sealed this

Twenty-second Day of June, 1999

Attest:

Q. TODD DICKINSON

Attesting Officer

Acting Commissioner of Patents and Trademarks